United States Patent
Do et al.

(10) Patent No.: US 10,868,206 B2
(45) Date of Patent: Dec. 15, 2020

(54) THIN FILM SOLAR CELL FOR BIPV AND METHOD FOR MANUFACTURING THE SAME

(71) Applicants: KOOKMIN UNIVERSITY INDUSTRY ACADEMY COOPERATION FOUNDATION, Seoul (KR); KOREA INSTITUTE OF SCIENCE AND TECHNOLOGY, Seoul (KR)

(72) Inventors: Young Rag Do, Seoul (KR); Byoung Koun Min, Seoul (KR)

(73) Assignees: KOOKMIN UNIVERSITY INDUSTRY ACADEMY COOPERATION FOUNDATION, Seoul (KR); KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 253 days.

(21) Appl. No.: 15/730,499

(22) Filed: Oct. 11, 2017

(65) Prior Publication Data
US 2018/0212090 A1   Jul. 26, 2018

(30) Foreign Application Priority Data
Jan. 24, 2017 (KR) .......... 10-2017-0010782

(51) Int. Cl.
*H01L 31/054*  (2014.01)
*H01L 31/0468*  (2014.01)
(Continued)

(52) U.S. Cl.
CPC .. *H01L 31/0549* (2014.12); *H01L 31/022425* (2013.01); *H01L 31/0468* (2014.12);
(Continued)

(58) Field of Classification Search
CPC .................................................. H01L 31/0549
(Continued)

(56) References Cited

U.S. PATENT DOCUMENTS

| 6,040,520 A * | 3/2000 | Morooka | ......... H01L 31/03921 136/245 |
| 2009/0025783 A1* | 1/2009 | Wernham | ............... G02B 5/282 136/256 |

FOREIGN PATENT DOCUMENTS

| JP | 2003234483 | 8/2003 |
| JP | 2010212336 | 9/2010 |

(Continued)

OTHER PUBLICATIONS

Yu et al., (Highly Efficient Semitransparent Polymer Solar Cells with Color Rendering Index Approaching 100 Using One-Dimensional Photonic Crystal), 2015.*
(Continued)

*Primary Examiner* — Niki Bakhtiari
(74) *Attorney, Agent, or Firm* — Norton Rose Fulbright US LLP

(57) ABSTRACT

Disclosed is a thin film solar cell for BIPV capable of improving a utility value for the exterior by visually changing a black color of an inorganic thin film solar cell into a color of reflected light therefrom to exhibit an exterior appearance having the color without substantially lowering efficiency required for a solar cell to thereby facilitate commercialization of the inorganic thin film solar cell. Also disclosed is a thin film solar cell for BIPV capable of maintaining a maximum power conversion efficiency (PCE) required for a solar cell when used as a finishing material of a building envelope, and visually changing a black color of an inorganic thin film solar cell into a color of reflected light therefrom to be suitable for the exterior with only a slight
(Continued)

reduction of relative harvesting efficiency and a short circuit photocurrent density without a decrease of an open circuit voltage $V_{oc}$.

8 Claims, 11 Drawing Sheets
(10 of 11 Drawing Sheet(s) Filed in Color)

(51) Int. Cl.
  *H02S 20/26* (2014.01)
  *H01L 31/18* (2006.01)
  *H01L 31/0224* (2006.01)
(52) U.S. Cl.
  CPC .............. *H01L 31/18* (2013.01); *H02S 20/26* (2014.12); *Y02B 10/10* (2013.01); *Y02E 10/52* (2013.01)

(58) Field of Classification Search
  USPC .................................................. 136/243–265
  See application file for complete search history.

(56) References Cited

FOREIGN PATENT DOCUMENTS

KR    1020110089865    8/2011
KR    1020140134758    11/2014

OTHER PUBLICATIONS

Calvo et al., (Porous one dimensional photonic crystals: novel multifunctional materials for environmental and energy applications), 2011.*

* cited by examiner

US 10,868,206 B2

THIN FILM SOLAR CELL FOR BIPV AND METHOD FOR MANUFACTURING THE SAME

CROSS-REFERENCE TO RELATED APPLICATION

This application claims priority to and the benefit of Korean Patent Application No. 10-2017-0010782, filed on Jan. 24, 2017. The contents of the referenced application are incorporated into the present application by reference.

BACKGROUND

1. Field of the Invention

The present disclosure relates to a thin film solar cell for BIPV and a method for manufacturing the same, and more particularly, to a thin film solar cell for BIPV, which is capable of improving a utility value for the exterior or the interior by visually changing a black color of an inorganic thin film solar cell into an aesthetically pleasing color of reflected light therefrom to exhibit an exterior appearance having the aesthetically pleasing color without a substantial reduction in efficiency required for a solar cell to thereby facilitate commercialization of the thin film solar cell for BIPV, and a method for manufacturing the same.

2. Discussion of Related Art

In recent years, the use of photovoltaic power generation facilities capable of generating power using solar energy is becoming increasingly common. A solar cell using such solar energy utilizes sunlight, which is a clean and infinite energy source, instead of fossil fuel such as coal or petroleum, and thus it is getting attention as a new future alternative energy source and is presently used to obtain power in a solar power plant, a building, a vehicle, and the like.

There are various application fields in photovoltaic power generation, but among them a building integrated photovoltaic (BIPV) technology, in which a solar cell is employed as a finishing material of a building envelope, has recently attracted worldwide attention as a promising new technology in the 21st century. The BIPV technology is an aggressive technology of developing a typical building envelope into a tool for generating energy by breaking from a point of view regarding a simple concept of protection against external stimuli, and thus a double effect of taking a part in supply and demand of solar cells and reducing costs for installation of a conventional solar cell system can be expected. One of the uses of solar cells as building exterior materials is solar cell exterior in which solar cells are coupled to the exterior.

Regarding the solar cell exterior, Korean Registered Patent No. 10-1541357 discloses a thin film solar cell for BIPV and a method for manufacturing the same. However, there is a problem in that a typical thin film solar cell for BIPV has an exterior appearance exhibiting a black color resulting in lowering of a utility value for the exterior or the interior, thereby causing a difficulty in commercialization, and there is a fatal weakness for the typical thin film solar cell for BIPV to cause a difficulty in exhibiting an aesthetically pleasing exterior appearance while maintaining efficiency required for a solar cell.

SUMMARY OF THE INVENTION

Therefore, it is an objective of the present disclosure is to provide a thin film solar cell for BIPV, which is capable of improving a utility value for the exterior or the interior by visually changing a black color of an inorganic thin film solar cell into an aesthetically pleasing color of reflected light therefrom to exhibit an exterior appearance having the aesthetically pleasing color without a substantial reduction in efficiency required for a solar cell and to thereby facilitate commercialization of the thin film solar cell for BIPV, and a method for manufacturing the same.

To resolve the above-described problems, the present disclosure provides a thin film solar cell for BIPV, which includes a substrate; an upper surface part of the substrate, the upper surface part including an electrode; and a lower surface part of the substrate, wherein a reflective filter is included in one or more of the upper surface part and the lower surface part of the substrate and is configured to reflect a portion of externally emitted light and transmit the remaining portion thereof to visually change a color of the thin film solar cell for BIPV into a color of reflected light therefrom.

In accordance with one preferred embodiment of the present disclosure, the upper surface part may include a first rear surface electrode and a front surface electrode which are formed to face each other on one surface of the substrate; a second rear surface electrode formed between the first rear surface electrode and the front surface electrode; and a light absorption layer formed between the second rear surface electrode and the front surface electrode, wherein the front surface electrode may be disposed at a side opposite to the substrate based on the first rear surface electrode.

In accordance with another preferred embodiment of the present disclosure, the reflective filter may be provided on the front surface electrode.

In accordance with still another preferred embodiment of the present disclosure, the reflective filter may be a one-dimensional photonic crystal dichroic nano-multilayered film.

In accordance with yet another preferred embodiment of the present disclosure, the one-dimensional photonic crystal dichroic nano-multilayered film may be a one-dimensional photonic crystal dichroic nano-multilayered blue color reflective film.

In accordance with yet another preferred embodiment of the present disclosure, the one-dimensional photonic crystal dichroic nano-multilayered film may be configured such that a first layer, a second layer, and a third layer are alternately stacked, a refractive index of the second layer may be different from that of the first layer, and a refractive index of the third layer may be the same as or different from that of the first layer.

In accordance with yet another preferred embodiment of the present disclosure, an optical thickness of each of the first layer and the third layer may be in a range of $\frac{1}{9}$ to $\frac{1}{7}$ optical thickness with respect to a center wavelength of the reflected light, and an optical thickness of the second layer may be in a range of $\frac{1}{5}$ to $\frac{1}{3}$ optical thickness with respect to the center wavelength of the reflected light.

In accordance with yet another preferred embodiment of the present disclosure, when the first layer, the second layer, and the third layer are alternately stacked, a repetition unit configured with the first-second-third layers may be repeatedly stacked 3 to 30 times.

In accordance with yet another preferred embodiment of the present disclosure, a thickness of the reflective filter is in a range of 0.3 to 5 micrometers (μm).

In accordance with yet another preferred embodiment of the present disclosure, the thin film solar cell BIPV may be scribed to serially connect the substrate, the upper surface part, and the lower surface part, and the reflective filter may not be scribed.

Also, the present disclosure provides a thin film solar cell for BIPV, which includes one or more one-dimensional photonic crystal dichroic nano-multilayered films, and satisfies conditions (a) and (b):

(a) A center wavelength of reflected light from each of the one-dimensional photonic crystal dichroic nano-multilayered films is in a range of 380 to 780 nm, and (b) A relational expression 1 is satisfied as follows, $$0.75 \le \frac{A}{B} \le 1.00,\qquad \text{[Relational Expression 1]}$$

wherein A is light harvesting efficiency when the one or more one-dimensional photonic crystal dichroic nano-multilayered films are employed, and B is light harvesting efficiency when a one-dimensional photonic crystal dichroic nano-multilayered film is not employed.

In accordance with one preferred embodiment of the present disclosure, the thin film solar cell for BIPV may further satisfy a condition (c):

(c) A relational expression 2 is satisfied as follows, $$0.90 \le \frac{C}{D} \le 1.00,\qquad \text{[Relational Expression 2]}$$

wherein C is an open circuit voltage $V_{oc}$ when the one or more one-dimensional photonic crystal dichroic nano-multilayered films are employed, and D is open circuit voltage $V_{oc}$ when a one-dimensional photonic crystal dichroic nano-multilayered film is not employed.

Also, the present disclosure provides a window which includes any one of the above-described thin film solar cells for BIPV.

BRIEF DESCRIPTION OF THE DRAWINGS

The patent or application file contains at least one drawing executed in color. Copies of this patent or patent application publication with color drawings(s) will be provided by the Office upon request of the necessary fee.

The above and other objects, features and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

Hereinafter, embodiments of the present disclosure will be fully described in detail to facilitate implementation by those skilled in the art with reference to the accompanying drawings.

As is described above, a conventional thin film solar cell for BIPV has outstanding stability and efficiency while having an exterior appearance of a black color resulting in lowering of a utility value for the exterior or the interior, thereby causing a problem of difficulty in commercialization. That is, conventionally, there is a problem in that it is difficult to maintain efficiency required for a thin film solar cell while exhibiting an aesthetically pleasing exterior appearance of the thin film solar cell.

To resolve the above-described problems, the present disclosure provides a thin film solar cell for BIPV, which includes a substrate; an upper surface part of the substrate, the upper surface part including an electrode; and a lower surface part of the substrate, wherein a reflective filter is included in one or more of the upper surface part and the lower surface part of the substrate and is configured to reflect a portion of externally emitted light and transmit the remaining portion thereof. With such a configuration, there is an effect in which a utility value for BIPV may be improved by visually changing a black color of an inorganic thin film solar cell into an aesthetically pleasing color of reflected light therefrom to exhibit an exterior appearance having the aesthetically pleasing color without a substantial reduction in efficiency required for a solar cell, thereby facilitating the commercialization of the inorganic thin film solar cell. In addition, even when the thin film solar cell for BIPV is used as a finishing material of a building envelope, there is an advantage suitable for the exterior, in which a maximum power conversion efficiency (PCE) required in a solar cell may be maintained, and a black color of an inorganic thin film solar cell may be visually changed into an aesthetically pleasing color of reflected light therefrom with only a slight reduction of relative harvesting efficiency and a short circuit photocurrent density without a decrease of an open circuit voltage $V_{oc}$.

Figure 1A:
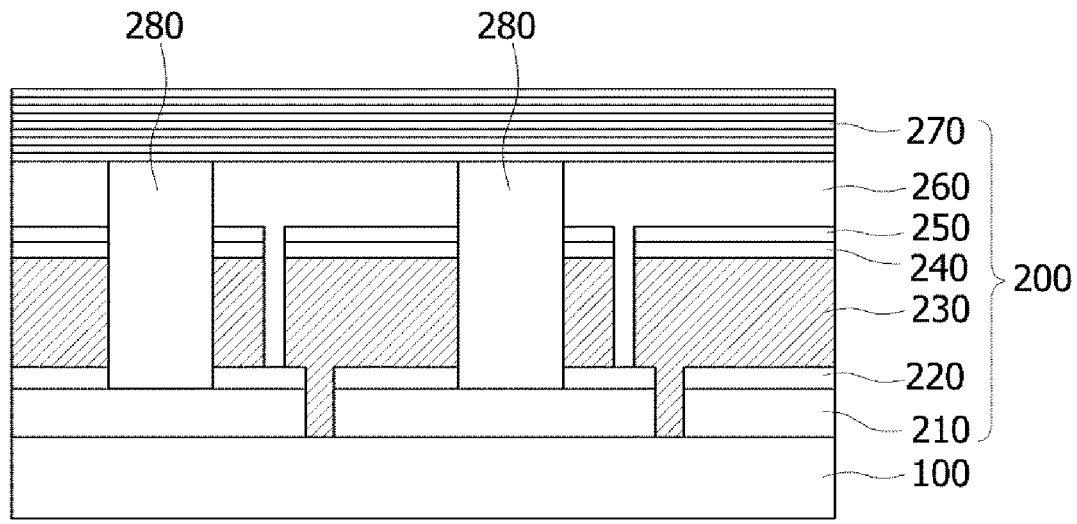
FIG. 1A: is a schematic diagram illustrating a structure of a thin film solar cell for BIPV, in which a one-dimensional photonic crystal dichroic nano-multilayered film is provided outside a solar cell module according to one preferred embodiment of the present disclosure.
Figure 1B:
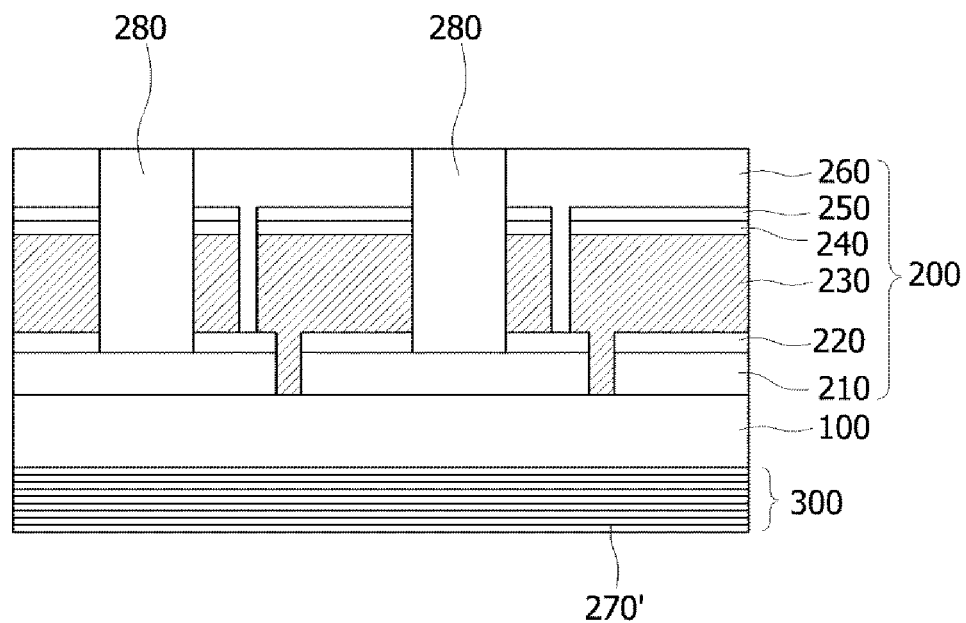
FIG. 1B: is a schematic diagram illustrating a structure of a thin film solar cell for BIPV, in which a one-dimensional photonic crystal dichroic nano-multilayered film is provided inside the solar cell module according to one preferred embodiment of the present disclosure.

Particularly, FIG. 1A-1B schematically illustrates a structure of a thin film solar cell for BIPV according to one preferred embodiment of the present disclosure, and particularly, FIG. 1A is a schematic diagram of a structure of a thin film solar cell for BIPV in which a one-dimensional photonic crystal dichroic nano-multilayered film is provided outside a solar cell module according to one preferred embodiment of the present disclosure, and FIG. 1B is a schematic diagram of a structure of a thin film solar cell for BIPV in which the one-dimensional photonic crystal dichroic nano-multilayered film is provided inside the solar cell module according to one embodiment of the present disclosure. The thin film solar cell for BIPV according to one preferred embodiment of the present disclosure includes a substrate 100, an upper surface part 200 formed on an upper surface of the substrate 100, a lower surface part 300 formed on a lower surface of the substrate 100, and a reflective filter 270 or 270'.

First, the substrate 100 will be described. The substrate 100 may employ a substrate that is conventionally used in a thin film solar cell, but preferably, it may employ a glass substrate including a soda-lime glass (SLG), a ceramic substrate, a metal substrate including a stainless-steel substrate, a polymer substrate, and the like.

Next, the upper surface part 200 formed on the upper surface of the substrate 100 will be described. The upper surface part 200 may employ a conventional configuration of a thin film solar cell, and preferably, it may refer to a portion that includes an electrode formed on any one surface of the substrate 100 to configure the thin film solar cell for BIPV.

In accordance with one preferred embodiment of the present disclosure, the upper surface part 200 may include a first rear surface electrode 210 and a front surface electrode 260 which are formed to face each other on one surface of the substrate 100, a second rear surface electrode 220 formed between the first rear surface electrode 210 and the front surface electrode 260, and a light absorption layer 230 formed between the second rear surface electrode 220 and the front surface electrode 260, and the front surface electrode 260 may be disposed at a side opposite to the substrate 100 based on the first rear surface electrode 210.

Next, it will be described that the first rear surface electrode 210 may be formed to face the front surface electrode 260 on one surface of the substrate 100. The first rear surface electrode 210 serves to receive electrons and holes, which are generated by the photoelectric effect, to deliver the received electrons and holes to the outside, and it may employ a transparent conductive material that is widely used in the related art. Preferably, the first rear surface electrode 210 may include one selected from a transparent conductive oxide (TCO) including at least one among indium oxide, zinc oxide, and tin oxide, a multilayer structured transparent electrode configured with TCO and a metal film, or a nanowire layer and TCO, and a transparent electrode in which a carbon material including at least one of graphene and a carbon nanotube is distributed. In this case, efficiency of the first rear surface electrode 210 may be increased by employing a transparent material, which has low light absorption and low resistivity in a visible or near-infrared light band, as the first rear surface electrode 210.

Next, it will be described that the front surface electrode 260 may be formed to face the first rear surface electrode 210 formed on one surface of the substrate 100.

The front surface electrode 260 serves to receive electrons and holes, which are generated by the photoelectric effect, to deliver the received electrons and holes to the outside, and it may employ an electrode that is configured as a transparent electrode made of a transparent conductive material to be able to implement a characteristic of a front electrode. Preferably, TCO such as indium tin oxide (ITO), F-doped tin oxide (FTO), zinc oxide (ZnO), antimony tin oxide (ATO), phosphorus-doped tin oxide (PTO), aluminum zinc oxide (AZO), and indium zinc oxide (IZO), or a material such as a chalcogenide may be employed.

Next, it will be described that the second rear surface electrode 220 may be formed between the first rear surface electrode 210 and the front surface electrode 260. The second rear surface electrode 220 serves to prevent a photocurrent loss. When the second rear surface electrode 220 is absent, there may occur a problem in that a Schottky barrier is formed between the light absorption layer 230 and the first rear surface electrode 210, thereby causing a photocurrent loss.

The second rear surface electrode 220 employed in the present disclosure may serve to secure partial light transmittance of the thin film solar cell for BIPV to improve utilization for the exterior or the interior, and there is no limitation in the material employed as long as it can realize a characteristic of the second rear surface electrode 220, but preferably, the second rear surface electrode 220 may be configured with a single layer or multiple layers including one or more selected from the group consisting of molybdenum (Mo), tungsten (W), titanium (Ti), copper (Cu), gold (Au), silver (Ag), niobium (Nb), and nickel (Ni). When such a second rear surface electrode 220 is formed, there exists a wavelength band with which a light absorption rate of the second rear surface electrode 220 with respect to the first rear surface electrode 210 is equal to or greater than 1 in a visible or near-infrared light band, and the first and second rear surface electrodes 210 and 220 are each configured with a material having low resistivity to easily secure transmittance of the thin film solar cell for BIPV so that there is an advantage in which the thin film solar cell for BIPV may be suitably utilized for the exterior or the interior.

Meanwhile, in accordance with one preferred embodiment of the present disclosure, the first rear surface electrode 210 may be formed to have a thickness in a range of 50 to 1000 nanometers (nm), and the second rear surface electrode 220 may be formed to have a thickness in a range of 10 to 1000 nm. Also, as will be described below, the second rear surface electrode 220 may be used as a sacrificial electrode when scribing is performed.

Next, it will be described that the light absorption layer 230 may be formed between the second rear surface electrode 220 and the front surface electrode 260. The light absorption layer 230 serves to absorb sunlight and may employ a material capable of configuring the thin film solar cell for BIPV and implementing a characteristic of a light absorption layer, and preferably, it may be configured with a material including at least one of copper (Cu) and silver (Ag), at least one among indium (In), gallium (Ga), aluminum (Al), zinc (Zn), and tin (Sn), and at least one of selenium (Se) and sulfur (S). More preferably, Se-based and/or S-based materials including $Cu(In,Ga)S_2$ (CIGS), $Cu(In,Ga)(S,Se)_2$ (CIGSSe), or the like may be employed. When the light absorption layer 230 is formed to configure the thin film solar cell for BIPV, stability and efficiency of the thin film solar cell for BIPV may be maintained.

Meanwhile, in accordance with one preferred embodiment of the present disclosure, a buffer layer 240, a window layer 250, and the front surface electrode 260 may be sequentially formed above the light absorption layer 230. That is, the buffer layer 240 and the window layer 250 may be formed at a side opposite to the substrate 100 based on the light absorption layer 230.

In accordance with one preferred embodiment of the present disclosure, the buffer layer 240 may employ a CdS thin film that is used in a conventional thin film solar cell. Also, the window layer 250 has a sufficiently large band gap to serve to increase light intensity of visible light reaching the light absorption layer 230, and at the same time, serve to lower resistance to enable electrons to be collected at an electrode, and preferably, the window layer 250 may employ ZnO, doped ZnO, or the like.

Next, it will be described that the reflective filter 270 or 270' is included in one or more of the upper surface part 200 and the lower surface part 300 of the substrate 100 and is configured to visually change a color of the thin film solar cell for BIPV into a color of reflected light therefrom by reflecting a portion of externally emitted light and transmitting the remaining portion thereof.

The reflective filter 270 or 270' may visually change a color of the thin film solar cell for BIPV into a color of reflected light therefrom by reflecting a portion of externally emitted light and secure transmittance by transmitting the remaining portion of the externally emitted light to thereby increase a utility value for the exterior or the interior.

The reflective filter 270 or 270' may employ a filter capable of implementing the above-described functions, but preferably, it may be a one-dimensional photonic crystal dichroic nano-multilayered film. Particularly, a long-wavelength pass dichroic filter (LWPF) may be employed to reflect a blue color of light, and a short-wavelength pass dichroic filter (SWPF) may be employed to reflect a yellow color of light or a red color of light. When a one-dimensional photonic crystal dichroic nano-multilayered film is employed, a color of reflected light from the one-dimensional photonic crystal dichroic nano-multilayered film may be used for colors of the exterior or the interior, with only a slight reduction of relative harvesting efficiency and a short circuit photocurrent density without a decrease of an open circuit voltage $V_{oc}$ required for a solar cell. Further, there is an effect in which the thin film solar cell for BIPV may be effectively utilized for the exterior or the interior.

In accordance with one preferred embodiment of the present disclosure, the one-dimensional photonic crystal dichroic nano-multilayered film is configured such that a first layer, a second layer, and a third layer may be alternately stacked, a refractive index of the second layer may be different from that of the first layer, and a refractive index of the third layer may be the same as or different from that of the first layer. That is, the one-dimensional photonic crystal dichroic nano-multilayered film may be a multilayer in which thin films made of high and low refractive index materials are alternately stacked, and preferably, the high refractive index material may be $TiO_2$ and the low refractive index material may be $SiO_2$. In this case, desired colors of reflected light and transmitted light are controllable in a range of a visible light region, that is, a violet color, a blue color, a yellow color, an orange color, and a red color, and thus a color of the thin film solar cell for BIPV may be visually and suitably changed and used for the exterior or the interior.

Preferably, an optical thickness of each of the first layer and the third layer may be in a range of ⅑ to ⅐ optical thickness with respect to a center wavelength of the reflected light, and an optical thickness of the second layer may be in a range of ⅕ to ⅓ optical thickness with respect to the center wavelength of the reflected light. Particularly, the meaning of the optical thickness of the first layer is in the range of ⅑ to ⅐ optical thickness with respect to the center wavelength of the reflected light refers to that the following relational expression may be satisfied.

$$\frac{D \text{ (optical thickness (nm))}}{\lambda \max \text{(center wavelength (nm))}} = \frac{1}{9} \sim \frac{1}{7}$$

Also, the meaning of that the optical thickness of the second layer is in the range of ⅕ to ⅓ optical thickness with respect to the center wavelength of the reflected light refers to that the following relational expression may be satisfied.

$$\frac{D \text{ (optical thickness (nm))}}{\lambda \max \text{(center wavelength (nm))}} = \frac{1}{5} \sim \frac{1}{3}$$

More preferably, the optical thickness of each of the first layer and the third layer may be in a range of 1/17 to 1/15 optical thickness with respect to the center wavelength of the reflected light, and the optical thickness of the second layer may be in a range of ⅑ to ⅐ optical thickness with respect to the center wavelength of the reflected light. When the optical thicknesses of the first, second, and third layers are each within the above-described ranges, there is an effect of transmittance becoming excellent. Also, as the optical thickness of each of the first layer and the third layer approaches a ⅛ optical thickness (that is, $\lambda_{max}/8n$, herein, n is a refractive index of the one-dimensional photonic crystal dichroic nano-multilayered film) with respect to the center wavelength of the reflected light, and also the optical thickness of the second layer approaches a ¼ optical thickness (that is, $\lambda_{max}/4n$, herein, n is the refractive index of the one-dimensional photonic crystal dichroic nano-multilayered film) with respect to the center wavelength of the reflected light, the transmittance becomes excellent so that there is an advantage of easily controlling the colors of the reflected light and transmitted light.

Further, when the first, second, and third layers are alternately stacked, they may be repeatedly stacked 3 to 30 times with a repetition unit of [the first layer/the second layer/the third layer], and preferably, may be repeatedly stacked 5 to 20 times, and more preferably, may be repeatedly stacked 7 to 15 times. When the repetition unit is repeatedly stacked to form the one-dimensional photonic crystal dichroic nano-multilayered film as described above, the one-dimensional photonic crystal dichroic nano-multilayered film has high reflectance as well as high transmittance so that there are advantages in which a distinct color change may be achieved and suitable relative harvesting efficiency may be attained.

That is, in accordance with one preferred embodiment of the present disclosure, the one-dimensional photonic crystal dichroic nano-multilayered film may be $[0.5SiO_2/TiO_2/0.5SiO_2]^m$ or $[0.5TiO_2/SiO_2/0.5TiO_2]^m$, and m is a repetition number of the repetition unit and may be in a range of 3 to 30.

Meanwhile, a thickness of the reflective filter 270 or 270' may be in a range of 0.3 to 0.5 μm, and preferably, in a range of 0.5 to 2 μm, but the thickness is not limited thereto.

Figure 2:
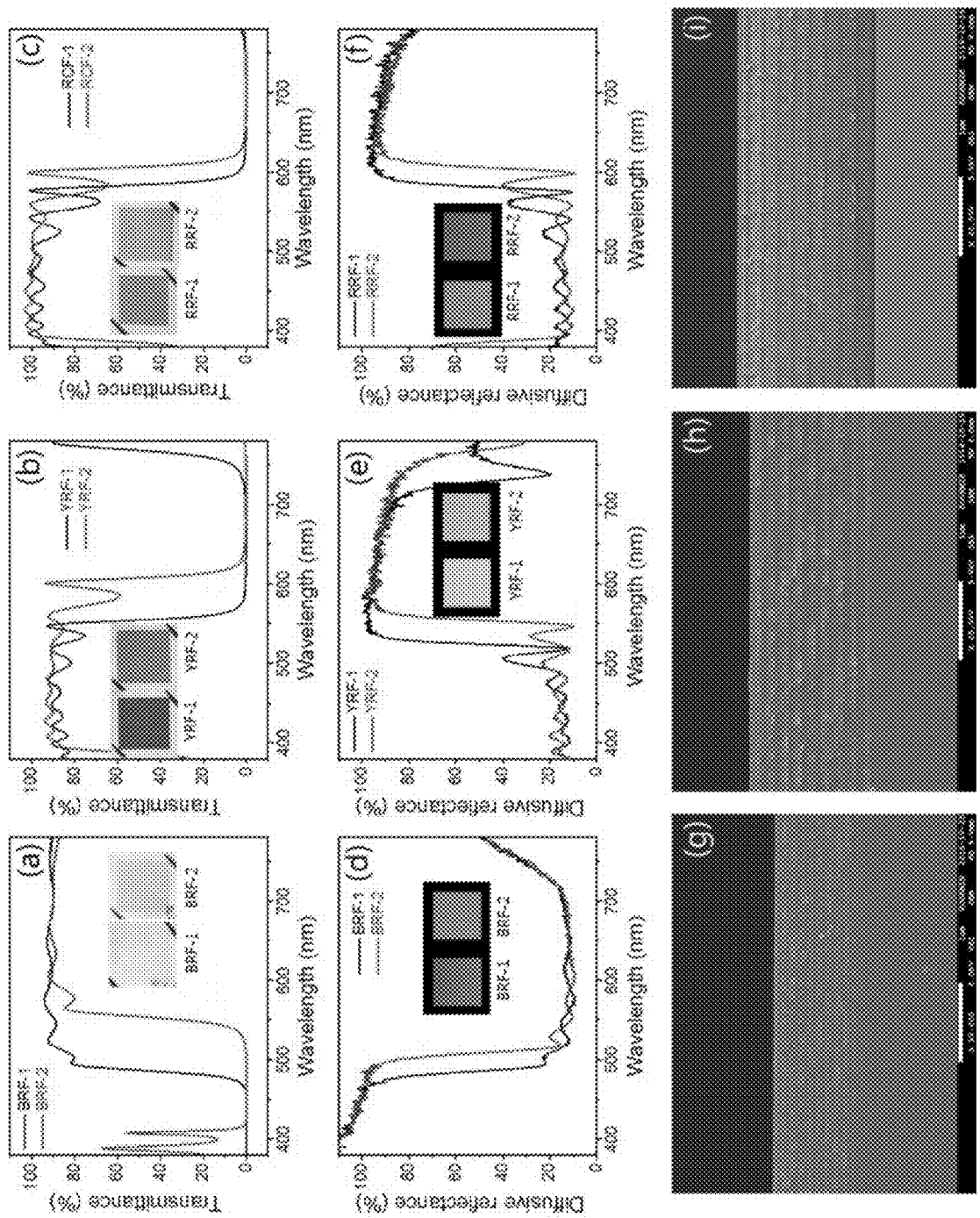
FIG. 2: (a) is a graph illustrating a transmittance spectrum of each of two types of one-dimensional photonic crystal dichroic nano-multilayered blue reflective films (BRFs), that is, BRF-1 and BRF-2, (b) is a graph illustrating a transmittance spectrum of each of two types of one-dimensional photonic crystal dichroic nano-multilayered yellow reflective films (YRFs), that is, YRF-1 and YRF-2, (c) is a graph illustrating a transmittance spectrum of each of two types of one-dimensional photonic crystal dichroic nano-multilayered red reflective films (RRFs), that is, RRF-1 and RRF-2, (d) is a graph illustrating a diffusive reflectance spectrum of each of BRF-1 and BRF-2, (e) is a graph illustrating a diffusive reflectance spectrum of each of YRF-1 and YRF-2, (f) is a graph of a diffusive reflectance spectrum of each of RRF-1 and RRF-2, and (g), (h), and (i) are each scanning electron microscope (SEM) cross-sectional images of BRF-1, YRF-1, and RRF-1 according to one preferred embodiment of the present disclosure, wherein colors of images shown in the graphs are actual colors of transmitted light and reflected light to and from the one-dimensional photonic crystal dichroic nano-multilayered BRFs, YRFs, and RRFs.

Particularly, FIG. 2: (a) is a graph illustrating a transmittance spectrum of each of two types of one-dimensional photonic crystal dichroic nano-multilayered blue reflective films (BRFs), that is, BRF-1 and BRF-2; (b) is a graph illustrating a transmittance spectrum of each of two types of one-dimensional photonic crystal dichroic nano-multilayered yellow reflective films (YRFs), that is, YRF-1 and YRF-2; (c) is a graph illustrating a transmittance spectrum of each of two types of one-dimensional photonic crystal dichroic nano-multilayered red reflective films (RRFs), that is, RRF-1 and RRF-2; (d) is a graph illustrating a diffusive reflectance spectrum of each of BRF-1 and BRF-2; (e) is a graph illustrating a diffusive reflectance spectrum of each of YRF-1 and YRF-2; (f) is a graph of a diffusive reflectance spectrum of each of RRF-1 and RRF-2; and (g), (h), and (i) are each scanning electron microscope (SEM) cross-sectional images of BRF-1, YRF-1, and RRF-1 according to one preferred embodiment of the present disclosure. Also, colors of images shown in the graphs are actual colors of transmitted light and reflected light to and from the one-dimensional photonic crystal dichroic nano-multilayered BRFs, YRFs, and RRFs. Looking at the drawings, each of BRF-1 and BRF-2 transmits a yellow color of light and reflects a blue color of light or a violet color of light, and it can be seen that a distinct color change may be possible on the basis of images of actual colors. Also, each of YRF-1 and YRF-2 transmits a blue color of light and reflects a yellow color of light, each of RRF-1 and RRF-2 transmits a blue color of light and reflects a red color of light or an orange color of light, and it can be seen that a distinct color change may be facilitated on the basis of the images of the actual colors. Further, as can be seen from the SEM images, a one-dimensional photonic crystal dichroic filter of the present disclosure may employ a nano-multilayered film.

Figure 3:
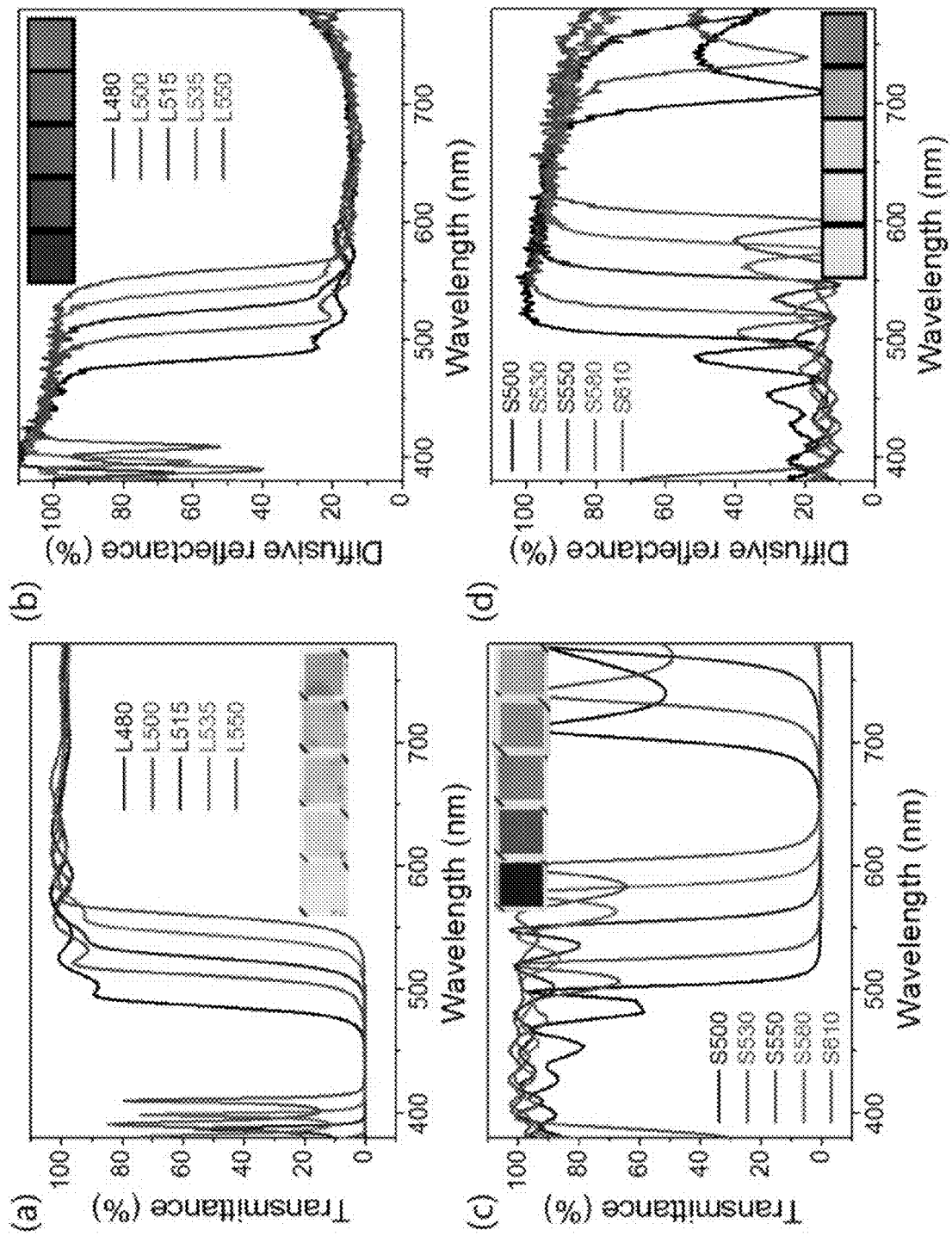
FIG. 3: (a) and (c) are each graphs illustrating transmittance spectra of different five BRF filters and different five RRF filters, and (b) and (d) are each graphs of diffusive reflectance spectra of the different five BRF filters and the different five RRF filters according to one preferred embodiment of the present disclosure.

In addition, FIG. 3: (a) and (c) are each graphs illustrating transmittance spectra of different five BRF filters and different five RRF filters, and (b) and (d) are each graphs of diffusive reflectance spectra of the different five BRF filters and the different five RRF filters according to one preferred embodiment of the present disclosure. As can be seen from the drawings, the reflective filter 270 or 270' of the present disclosure exhibits a violet color, a blue color, a yellow color, an orange color, and a red color of reflected light in a wavelength range of 400 to 800 nm.

Figure 4:
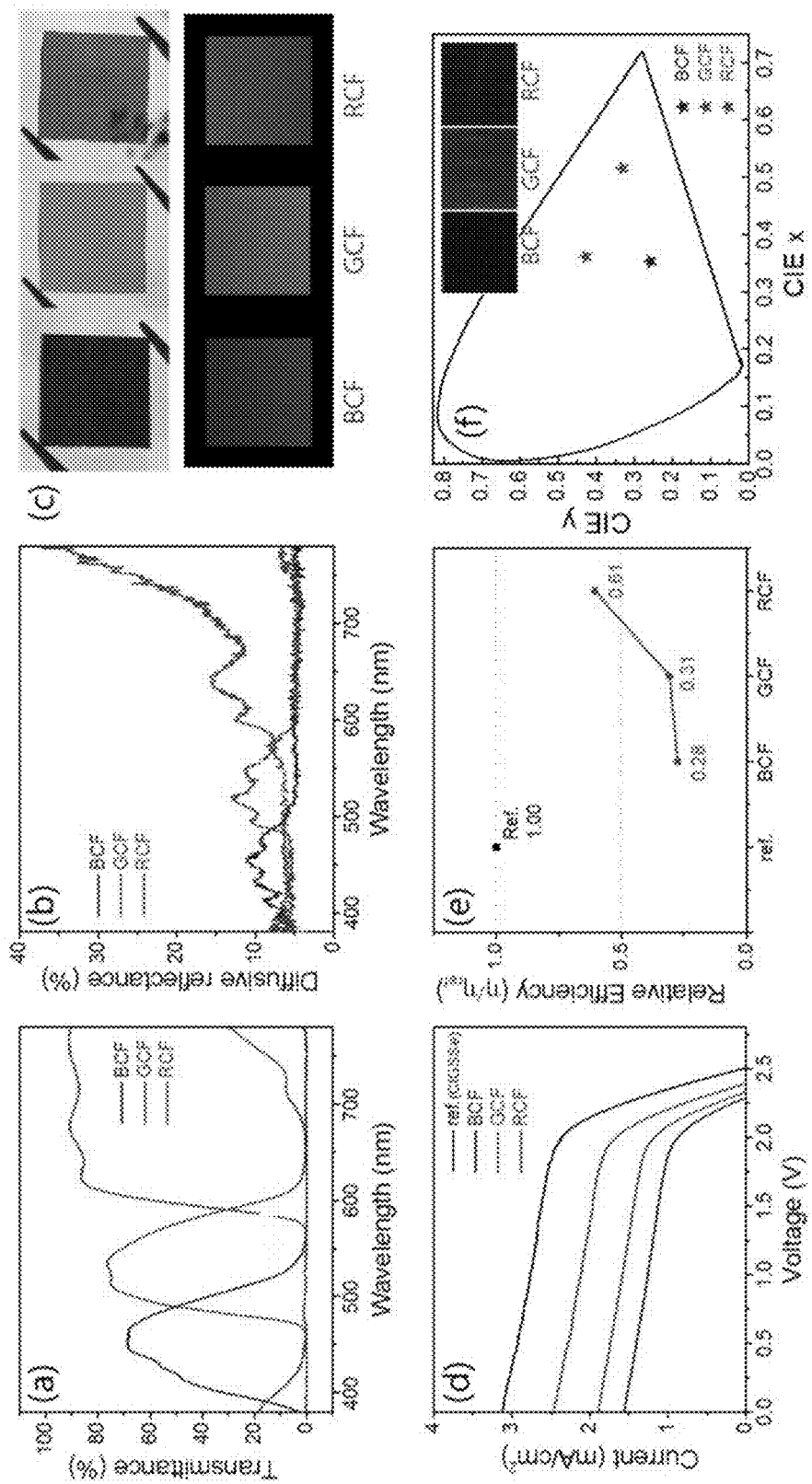
FIG. 4: (a) and (b) are each graphs of a transmittance spectrum and a diffusive reflectance spectrum of each of conventional red/green/blue (RGB) color filters, (c) includes images of actual colors of reflected light (an upper portion of (c)) and transmitted light (a lower portion of (c)) to and from the conventional RGB color filters in a lighting condition of white sunlight, (d) is a scanning graph illustrating a current density-voltage of each of the conventional RGB color filters, (e) is a graph illustrating relative harvesting efficiencies for a partial light transmission copper indium gallium disulfoselenide (CIGSSe) photovoltaic (PV) module to which the conventional RGB color filters are attached, and (f) includes images of actual colors of the partial light transmission CIGSSe PV module to which the conventional RGB color filters are attached and a graph illustrating Commission Internationale de l'Eclairage (CIE) color coordinates thereof.

Meanwhile, FIG. 4: (a) and (b) are each graphs of a transmittance spectrum and a diffusive reflectance spectrum of each of conventional red/green/blue (RGB) color filters, (c) includes images of actual colors of reflected light (an upper portion of (c)) and transmitted light (a lower portion of (c)) to and from the conventional RGB color filters in a lighting condition of white sunlight, (d) is a scanning graph illustrating a current density-voltage of each of the conventional RGB color filters, (e) is a graph illustrating relative harvesting efficiencies for a partial light transmission copper indium gallium disulfoselenide (CIGSSe) photovoltaic (PV) module to which the conventional RGB color filters are attached, and (f) includes images of actual colors of the partial light transmission CIGSSe PV module to which the conventional RGB color filters are attached and a graph illustrating Commission Internationale de l'Éclairage (CIE) color coordinates thereof. When the conventional RGB color filters and the partial light transmission CIGSSe PV module are coupled, as can be seen from the drawings, a color change is not as clear as that of the reflective filter 270 or 270' of the present disclosure due to low reflectance of each of the conventional RGB color filters as well as exhibition of dark red, green, and blue colors at the outside thereof. Further, as can be seen from the scanning graph illustrating the current densities-voltages of (d), when the conventional RGB color filters are employed, maximum PCEs are each decreased from 5.31% (that is, a reference value in a treatise in which a cover glass is not applied) to 3.22%, 1.63%, and 1.46%, thus lowering efficiency required for a solar cell.

In accordance with one embodiment of the present disclosure, the one-dimensional photonic crystal dichroic nano-multilayered film may be a one-dimensional photonic crystal dichroic nano-multilayered BRF. When the one-dimensional photonic crystal dichroic nano-multilayered BRF is employed as the reflective filter 270 or 270', a black color of an inorganic thin film solar cell may be visually changed into an aesthetically pleasing violet or blue color of reflected light therefrom. Also, due to a decrease of an overlap region between an absorption spectrum of the inorganic thin film solar cell and a reflection spectrum of the one-dimensional photonic crystal dichroic nano-multilayered BRF, there is an effect in which a visual color change is achieved with only a slight reduction of relative harvesting efficiency and a short circuit photocurrent density without a decrease of an open circuit voltage $V_{oc}$.

Figure 5:
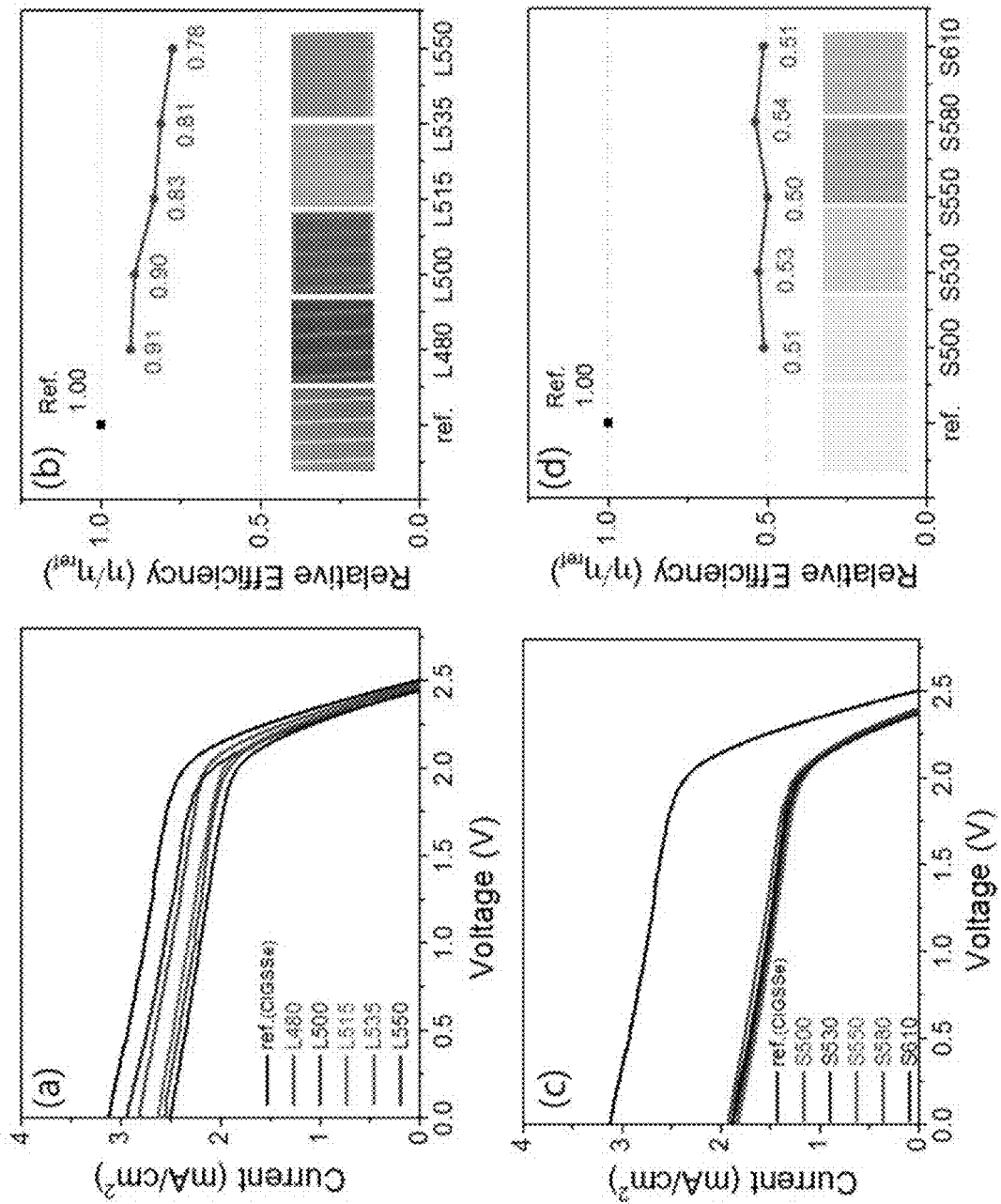
FIG. 5: (a) and (b) are each a scanning graph illustrating current densities-voltages and a graph illustrating relative harvesting efficiencies for a partial light transmission CIGSSe PV module including different five BRFs, and (c) and (d) are each a scanning graph illustrating current densities-voltages and a graph illustrating relative harvesting efficiencies for a partial light transmission CIGSSe PV module including different five RRFs according to one preferred embodiment of the present disclosure.

Particularly, FIG. 5: (a) and (b) are each a scanning graph illustrating current densities-voltages and a graph illustrating relative harvesting efficiencies for a partial light transmission CIGSSe PV module including different five BRFs, and (c) and (d) are each a scanning graph illustrating current densities-voltages and a graph illustrating relative harvesting efficiencies for a partial light transmission CIGSSe PV module including different five RRFs according to one preferred embodiment of the present disclosure. As can be seen from the scanning graphs illustrating the current densities-voltages in (a) and (c), short circuit photocurrent densities are over 2 mA/cm$^2$ when the thin film solar cell for BIPV employs BRFs, and short circuit photocurrent densities are below 2 mA/cm$^2$ when the thin film solar cell for BIPV employs RRFs. Further, as can be seen from the graphs illustrating the relative harvesting efficiencies in (b) and (d), the relative harvesting efficiencies are in a range of 0.78 to 0.91 when BRFs are employed, and the relative harvesting efficiencies are in a range of 0.51 to 0.54 when RRFs are employed.

As can be seen from the above description, when BRFs are employed, the photocurrent densities are not significantly reduced compared to those when RRFs are employed, and the relative harvesting efficiencies are also similar to those of the conventional thin film solar cell so that excellent efficiency required for a thin film solar cell may be maintained while an aesthetically pleasing color of reflected light may be exhibited. On the other hand, it can be seen that, when RRFs are employed, there is exhibited a characteristic in which a reduction of the short circuit photocurrent densities and the relative harvesting efficiencies is not remarkable, but efficiency is lower compared to that when BRFs are employed. That is, when the one-dimensional photonic crystal dichroic nano-multilayered film, and particularly, the one-dimensional photonic crystal dichroic nano-multilayered BRF is employed as the reflective filter 270 or 270' of the present disclosure, a blue color or a violet color which is a color of reflected light from the one-dimensional photonic crystal dichroic nano-multilayered BRF may be used for colors of the exterior or the interior with only the slight reduction of the relative harvesting efficiency and the short circuit photocurrent density so that the thin film solar cell for BIPV may be usefully utilized for the exterior or the interior.

Meanwhile, when the reflective filter 270 or 270' is included in one or more of the upper surface part 200 and the lower surface part 300 of the substrate 100, the thin film solar cell for BIPV reflects a portion of externally emitted light to have an aesthetic effect and at the same time transmits the remaining portion thereof to secure transmittance such that a utility value for the exterior or the interior may be significantly improved.

Particularly, the including of the reflective filter 270 or 270' in one or more of the upper surface part 200 and the lower surface part 300 of the substrate 100 means that the reflective filter 270 or 270' is provided in the upper surface part 200 and/or the lower surface part 300 of the substrate 100, and includes all cases in which the reflective filter 270 or 270' is provided to come into direct and close contact with the substrate 100 and other electrodes or layers are provided between the substrate 100 and the reflective filter 270 or 270'. That is, the reflective filter 270 or 270' may be included in one or more of the upper surface part 200 and the lower surface part 300 of the substrate 100 to be provided at a position at which a color of the thin film solar cell for BIPV may be visually changed into a color of reflected light therefrom by reflecting a portion of externally emitted light and transmitting the remaining portion thereof.

Figure 6:
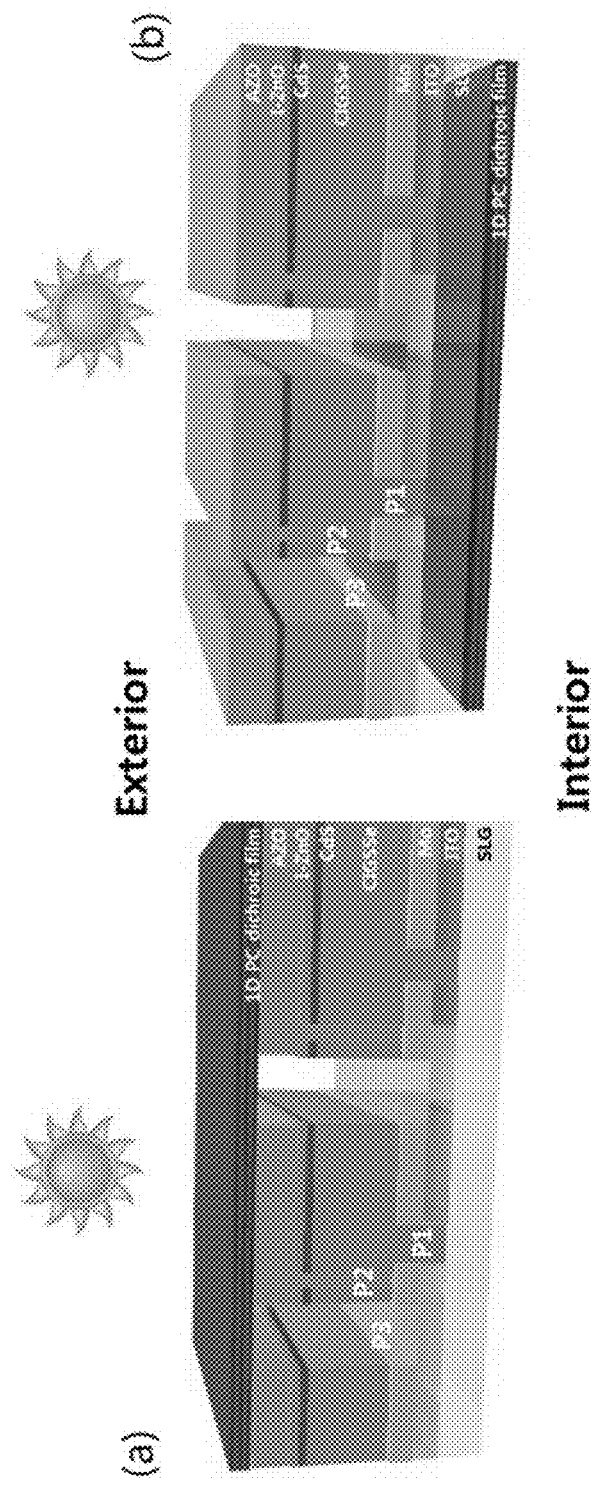
FIG. 6: (a) and (b) are each schematic diagrams illustrating different two device structures in which a one-dimensional photonic crystal dichroic nano-multilayered film is provided outside (a) and inside (b) a CIGSSe PV module according to one preferred embodiment of the present disclosure.

Particularly, FIG. 6: (a) and (b) are each schematic diagrams illustrating different two device structures in which a one-dimensional photonic crystal dichroic nano-multilayered film is provided outside and inside a CIGSSe PV module according to one preferred embodiment of the present disclosure. As can be seen from the drawings, the reflective filter 270 of the present disclosure may be provided on the front surface electrode 260 of the upper surface part 200 of the substrate 100, or the reflective filter 270' of the present disclosure may be provided in the lower surface part 300 of the substrate 100. Further, it can be seen that the reflective filter 270 is disposed at an outer side surface of a building when provided in the upper surface part 200, and the reflective filter 270' is disposed at an inner side surface of the building when provided in the lower surface part 300.

Figure 7:
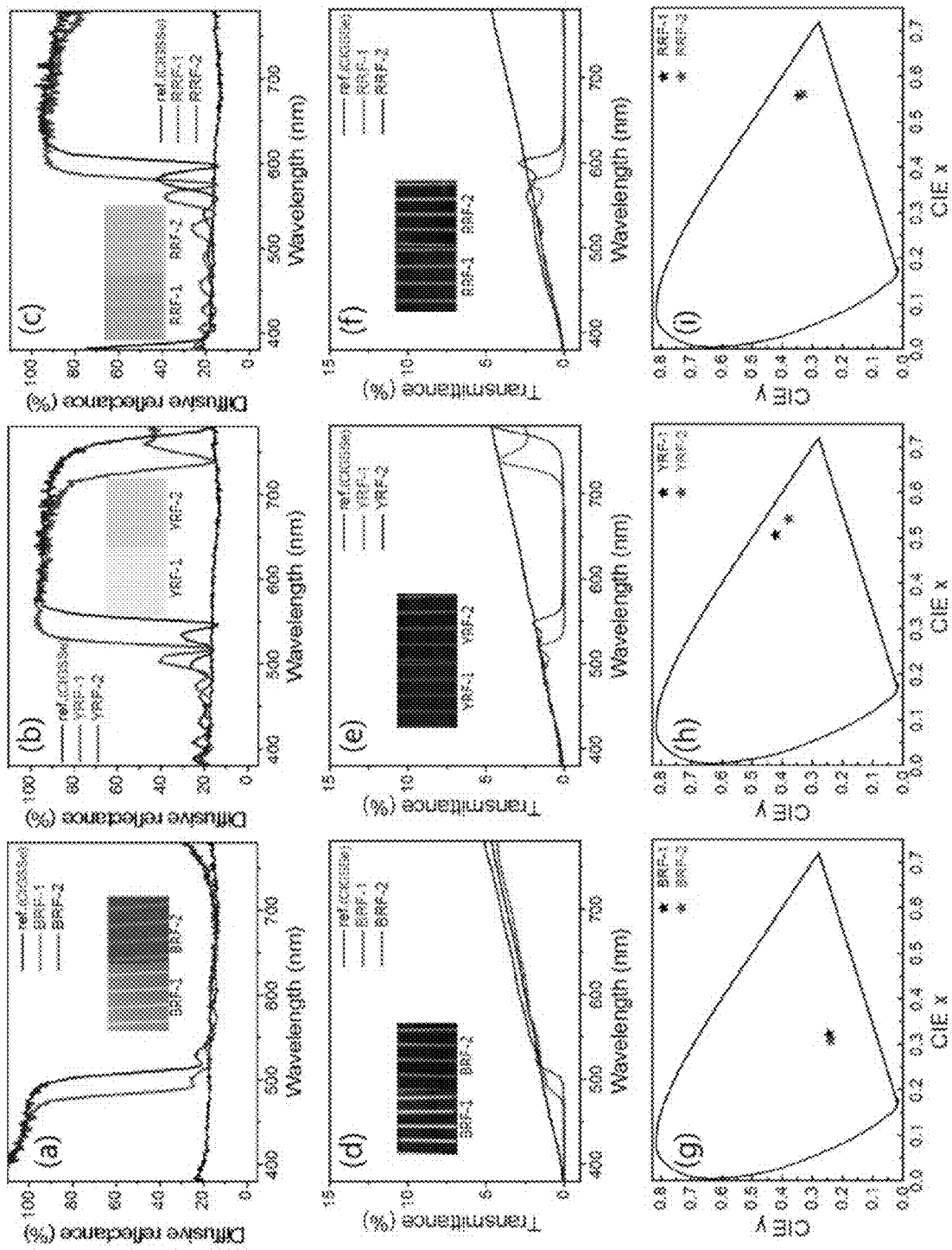
FIG. 7: (a), (b), and (c) are each graphs illustrating diffusive reflectance spectra of two types of one-dimensional photonic crystal dichroic nano-multilayered BRF samples, two types of one-dimensional photonic crystal dichroic nano-multilayered YRF samples, and two types of one-dimensional photonic crystal dichroic nano-multilayered RRF samples, wherein each of the two types of BRF samples, the two types of YRF samples, and the two types of RRF samples cover an exterior of a CIGSSe PV module of which 10% is partially scribed, (d), (e), and (f) are each graphs illustrating transmittance spectra of the two types of BRF samples, the two types of YRF samples, and the two types of RRF samples, and (g), (h), and (i) are each graphs illustrating CIE color coordinates of the two types of BRF samples, the two types of YRF samples, and the two types of RRF samples (here, images shown in the drawings are images of actual colors of transmitted light and reflected light to and from the one-dimensional photonic crystal dichroic nano-multilayered BRF, YRF, and RRF samples which each cover the exterior of the CIGSSe PV module of which 10% is partially scribed) according to one preferred embodiment of the present disclosure.

In addition, FIG. 7: (a), (b), and (c) are each graphs illustrating diffusive reflectance spectra of two types of one-dimensional photonic crystal dichroic nano-multilayered BRF samples, two types of one-dimensional photonic crystal dichroic nano-multilayered YRF samples, and two types of one-dimensional photonic crystal dichroic nano-multilayered RRF samples, wherein each of the two types of BRF samples, the two types of YRF samples, and the two types of RRF samples cover an exterior of a CIGSSe PV module of which 10% is partially scribed, (d), (e), and (f) are each graphs illustrating transmittance spectra of the two types of BRF samples, the two types of YRF samples, and the two types of RRF samples, and (g), (h), and (i) are each graphs illustrating CIE color coordinates of the two types of BRF samples, the two types of YRF samples, and the two types of RRF samples (here, images shown in the drawings are images of actual colors of transmitted light and reflected light to and from the one-dimensional photonic crystal dichroic nano-multilayered BRF, YRF, and RRF samples which each cover the exterior of the CIGSSe PV module of which 10% is partially scribed) according to one preferred embodiment of the present disclosure. As can be seen from the drawings, when the reflective filter 270 according to the present disclosure is included in the upper surface part 200 of the substrate 100, a black color of an inorganic thin film solar cell may be visually changed into a color of reflected light from the reflective filter 270. Further, as can be seen from the graphs illustrating the CIE color coordinates in (g), (h), and (i), the black color of the inorganic thin film solar cell may be clearly changed into a blue color, a yellow color, or a red color by introducing the reflective filter 270 into the upper surface part 200.

Figure 8:
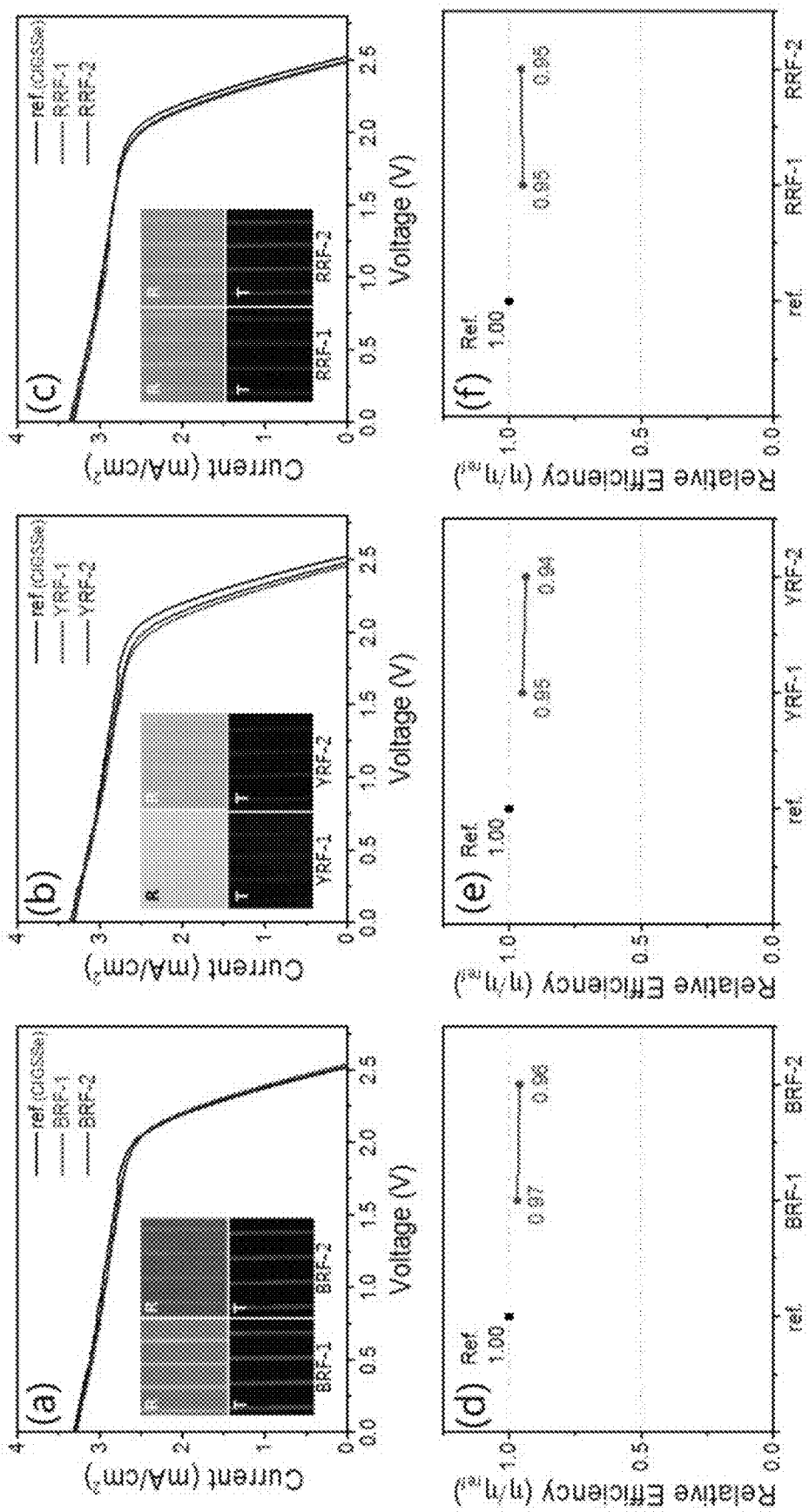
FIG. 8: (a), (b), and (c) are each scanning graphs illustrating current densities-voltages of two types of BRF samples, two types of YRF samples, and two types of RRF samples (here, images shown in the drawings are images of actual colors of transmitted light (T) and reflected light (R) to and from the one-dimensional photonic crystal dichroic nano-multilayered BRF, YRF, and RRF samples which each cover an interior of the CIGSSe PV module of which 10% is partially scribed), and (d), (e) and (f) are each graphs illustrating relative harvesting efficiencies for the two types of BRF samples, the two types of YRF samples, and the two types of RRF samples, wherein the two types of BRF samples, the two types of YRF samples, and the two types of RRF samples cover the interior of the CIGSSe PV module of which 10% is partially scribed in a lighting condition of sunlight (for example, 100 mW/cm$^2$) according to one preferred embodiment of the present disclosure.

In addition, FIG. 8: (a), (b), and (c) are each scanning graphs illustrating current densities-voltages of two types of BRF samples, two types of YRF samples, and two types of RRF samples (here, images shown in the drawings are images of actual colors of transmitted light (T) and reflected light (R) to and from the one-dimensional photonic crystal dichroic nano-multilayered BRF, YRF, and RRF samples which each cover an interior of the CIGSSe PV module of which 10% is partially scribed), and (d), (e), and (f) are each graphs illustrating relative harvesting efficiencies for the two types of BRF samples, the two types of YRF samples, and the two types of RRF samples, wherein the two types of BRF samples, the two types of YRF samples, and the two types of RRF samples cover the interior of the CIGSSe PV module of which 10% is partially scribed in a lighting condition of sunlight (for example, 100 mW/cm$^2$) according to one preferred embodiment of the present disclosure. As can be seen from the drawings, even when the reflective filter 270' of the present disclosure is included in the lower surface part 300 of the substrate 100, the black color of the inorganic thin film solar cell may be visually effectively changed into a color of reflected light from the reflective filter 270'. That is, the thin film solar cell for BIPV of the present disclosure may be utilized in various applications by not only exhibiting a building with an aesthetically pleasing exterior appearance but also providing an aesthetically pleasing interior decoration effect in terms of an interior.

As is described above, the reflective filter 270 or 270' of the present disclosure may be included inside or provided outside the upper surface part 200 and/or the lower surface part 300 of the substrate 100, but preferably, it is advantageous to be provided outside the upper surface part 200 and/or the lower surface part 300. When a reflective filter is conventionally provided outside the upper surface part 200, the thin film solar cell exhibits a black color of an exterior appearance, resulting in lowering of a utility value for the exterior or the interior, thereby causing a difficulty in commercialization, but in accordance with the present disclosure, the reflective filter 270 may be provided on the front surface electrode 260 of the upper surface part 200, and even in such a case, the black color of the exterior or the interior appearance may be visually changed into a color of reflected light from the reflective filter 270 with only a slight reduction of relative harvesting efficiency and a short circuit photocurrent density so that there is an effect in which the thin film solar cell can be usefully utilized for the exterior or the interior.

Figure 9:
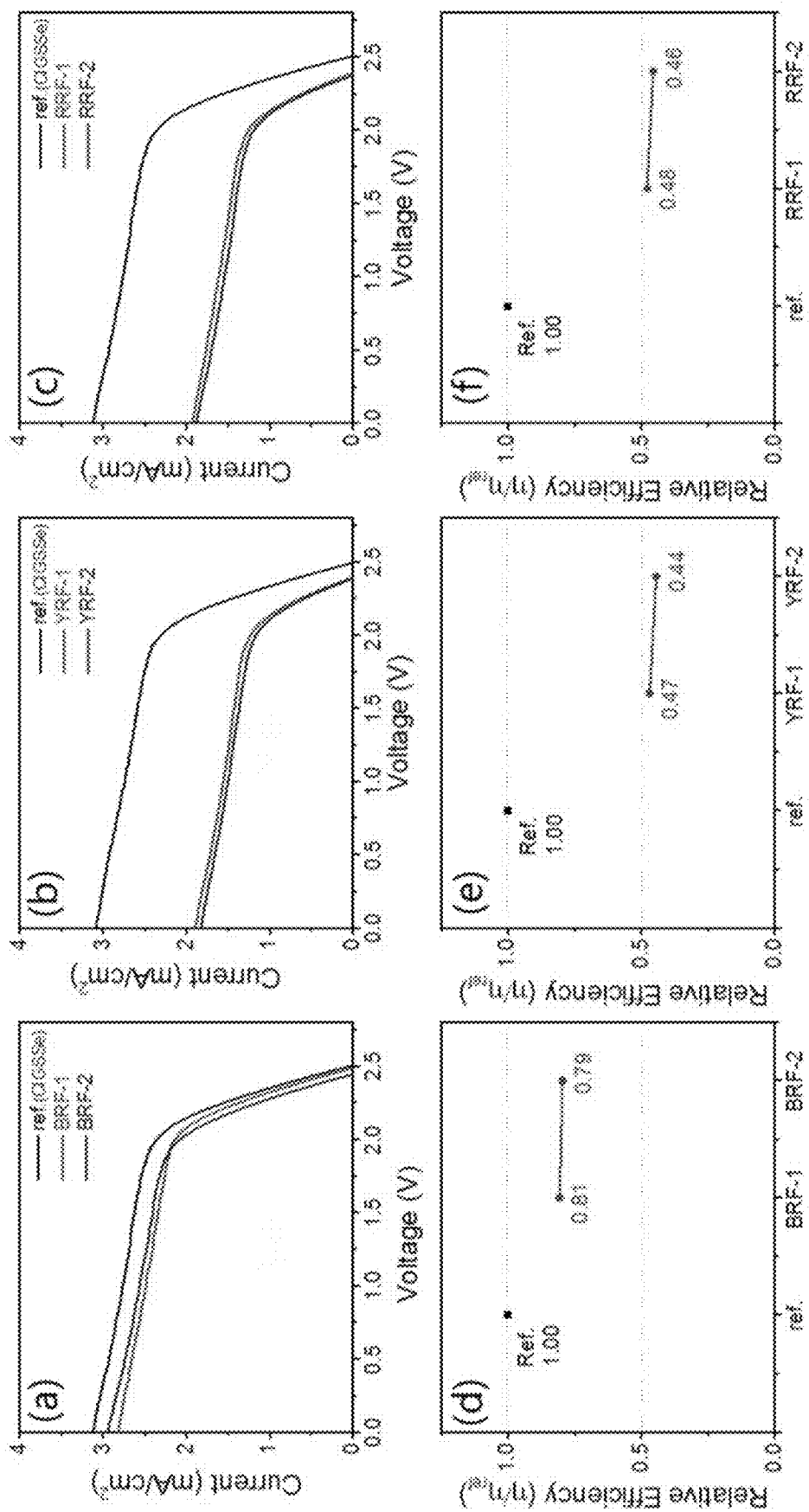
FIG. 9: (a), (b), and (c) are each scanning graphs illustrating current densities-voltages of the two types of BRF samples, the two types of YRF samples, and the two types of RRF samples, and (d), (e), and (f) are each graphs illustrating relative harvesting efficiencies for the two types of BRF samples, the two types of YRF samples, and the two types of RRF samples, wherein the two types of BRF samples, the two types of YRF samples, and the two types of RRF samples cover the exterior of the CIGSSe PV module of which 10% is partially scribed in the lighting condition of sunlight (that is, 100 mW/cm$^2$) according to one preferred embodiment of the present disclosure.

Particularly, FIG. 9: (a), (b), and (c) are each scanning graphs illustrating current densities-voltages of the two types of BRF samples, the two types of YRF samples, and the two types of RRF samples, and (d), (e), and (f) are each graphs illustrating relative harvesting efficiencies for the two types of BRF samples, the two types of YRF samples, and the two types of RRF samples, wherein the two types of BRF samples, the two types of YRF samples, and the two types of RRF samples cover the exterior or the interior of the CIGSSe PV module of which 10% is partially scribed in the lighting condition of sunlight (that is, 100 mW/cm$^2$) according to one preferred embodiment of the present disclosure. As can be seen from the drawings, even when the reflective filter 270 is provided on the front surface electrode 260 to be disposed at an outer side of the thin film solar cell, only a slight reduction of a short circuit photocurrent density and relative harvesting efficiency occurs compared to when the reflective filter 270' is provided inside the lower surface part 300 as shown in FIG. 8. That is, in accordance with the present disclosure, it can be seen that there are advantages in which the inorganic thin film solar cell may be provided at an outer side surface of a building, a black color of the inorganic thin film solar cell may be visually changed into an aesthetically pleasing color and at the same time efficiency required for a solar cell may be excellently maintained.

Meanwhile, in accordance with one preferred embodiment of the present disclosure, the thin film solar cell for BIPV may be scribed to serially connect the substrate 100, the upper surface part 200, and the lower surface part 300 while the reflective filter 270 or 270' may not be scribed. The scribing may be preferably performed through a mechanical scribing process, and light transmittance may be sufficiently secured through the scribing so that there is an effect in which the thin film solar cell for BIPV may be usefully utilized for the exterior or the interior. Also, when the second rear surface electrode 220 employed in the present disclosure is opaque, a light transmittance region may be secured by configuring the second rear surface electrode 220 as a sacrificial layer to remove a portion of the second rear surface electrode 220.

Particularly, the connecting of the substrate 100, the upper surface part 200, and the lower surface part 300 in series means that electrodes and layers, which configure the thin film solar cell for BIPV except for the substrate 100 and the reflective filter 270 or 270', are vertically connected in series based on the substrate 100. For example, looking at FIG. 1 (a), a scribed hollow space 280 may be formed through laser scribing or mechanical scribing to serially connect the second rear surface electrode 220, the light absorption layer 230, the buffer layer 240, the window layer 250, and the front surface electrode 260, which are disposed above the substrate 100. Also, it can be seen that laser scribing or mechanical scribing may be performed except on the substrate 100, the first rear surface electrode 210, and the reflective filter 270 or 270'.

That is, the present disclosure may attain an effect capable of visually changing a black color into an aesthetically pleasing color exhibited on an exterior appearance by providing the reflective filter 270 or 270' and at the same time through scribing without substantially lowering efficiency required for a solar cell.

Also, to resolve the above-described problems, the present disclosure provides the thin film solar cell for BIPV, which includes one or more one-dimensional photonic crystal dichroic nano-multilayered films and satisfies the following conditions (a) and (b).

(a) A center wavelength of reflected light from each of the one-dimensional photonic crystal dichroic nano-multilayered films is in a range of 380 to 780 nm.

(b) The following relational expression 1 is satisfied.

$$0.75 \leq \frac{A}{B} \leq 1.00 \quad \text{[Relational Expression 1]}$$

Here, A is light harvesting efficiency when the one or more one-dimensional photonic crystal dichroic nano-multilayered films are employed, and B is light harvesting efficiency when a one-dimensional photonic crystal dichroic nano-multilayered film is not employed. Thus, a utility value for the exterior or the interior may be improved by visually changing the black color of the inorganic thin film solar cell into an aesthetically pleasing color to exhibit an exterior appearance having the aesthetically pleasing color without substantially lowering efficiency required for a solar cell, and thus there is an effect of facilitating commercialization of the thin film solar cell for BIPV. In addition, even when the thin film solar cell for BIPV is utilized as a finishing material of a building envelope, there are advantages in which a maximum PCE required for a solar cell may be maintained, and the black color of the inorganic thin film solar cell may be visually changed into an aesthetically pleasing color to be suitable for BIPV with only a slight reduction of relative harvesting efficiency and a short circuit photocurrent density.

The center wavelength of the reflected light from each of the one or more one-dimensional photonic crystal dichroic nano-multilayered films is in the range of 380 to 780 nm, and A/B is in a range of 0.75 to 1.00. The center wavelength may be preferably in a range of 380 to 550 nm, and A/B may be preferably in a range of 0.76 to 0.96. More preferably, A/B may be in a range of 0.77 to 0.93. When A/B is within one of the above-described ranges, there may be substantially no reduction in the light harvesting efficiency and further the black color of the inorganic thin film solar cell may be visually changed to exhibit an aesthetically pleasing violet color or blue color, and thus there is an effect in which the inorganic thin film solar cell is suitable for the thin film solar cell for BIPV. When A/B is less than 0.75, a color of the exterior or the interior appearance of the inorganic thin film solar cell may be visually changed into an aesthetically pleasing color, but a problem in that efficiency of the inorganic thin film solar cell is abruptly lowered may occur.

In accordance with one preferred embodiment of the present disclosure, the thin film solar cell for BIPV may further satisfy the following condition (c).

(c) The following relational expression 2 is satisfied.

$$0.90 \leq \frac{C}{D} \leq 1.00 \quad \text{[Relational Expression 2]}$$

Here, C is an open circuit voltage $V_{oc}$ when the one or more one-dimensional photonic crystal dichroic nano-multilayered films are employed, and D is an open circuit voltage $V_{oc}$ when a one-dimensional photonic crystal dichroic nano-multilayered film is not employed.

C/D may be preferably in a range of 0.92 to 1.00, and more preferably, in a range of 0.94 to 1.00. When C/D is in one of the above-described ranges, a utility value for the exterior or the interior may be improved by visually changing the black color of the inorganic thin film solar cell into an aesthetically pleasing color to exhibit an exterior appearance having the aesthetically pleasing color while the open circuit voltage $V_{oc}$ is maintained, and thus there is an effect of facilitating commercialization of the inorganic thin film solar cell. When C/D is less than 0.90, a visual color change of the exterior or the interior appearance of the inorganic thin film solar cell may be possible, but a problem in that the efficiency of the inorganic thin film solar cell is lowered may occur.

Also, the present disclosure provides a window which includes one or more thin film solar cells for BIPV. In this case, some light in a wavelength region of sunlight is reflected to be visually observed by a human, and the other part is transmitted to become a power source for driving the thin film solar cell for BIPV. Through various experiments, it is verified that the present disclosure visually changes the black color of the thin film solar cell for BIPV into an aesthetically pleasing color of reflected light through the reflective filter 270 or 270' to improve a utility value for the exterior or the interior without lowering efficiency required for a solar cell.

Figure 10:
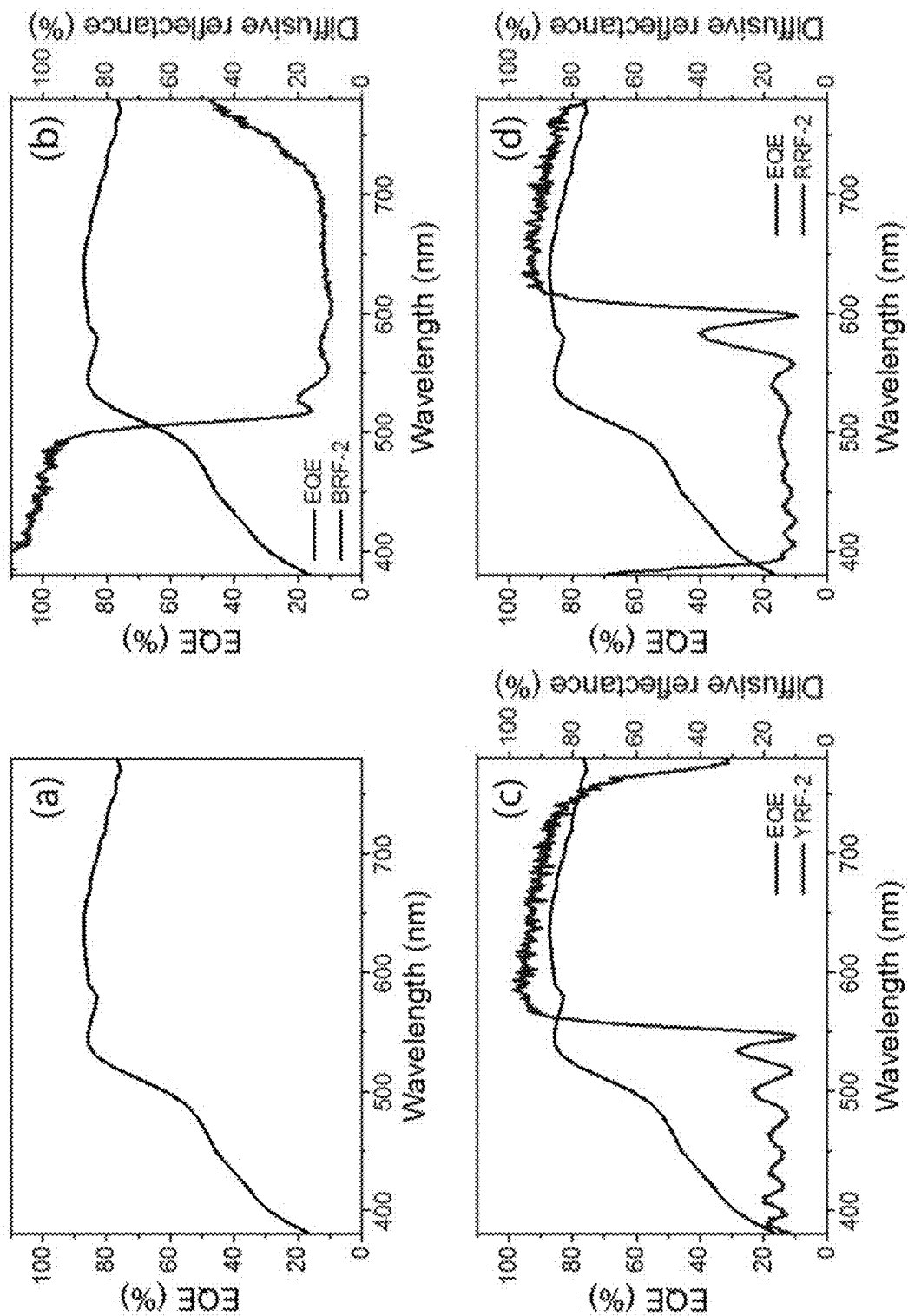
FIG. 10: (a) is a graph illustrating an external quantum efficiency (EQE) spectrum for a CIGSSe thin film solar cell according to one preferred embodiment of the present disclosure, and (b), (c), and (d) are each graphs illustrating diffusive reflectance spectra of BRF, YRF, and RRF together with the EQE spectra for the CIGSSe thin film solar cell before a CIGSSe PV module is converted.
Figure 11:
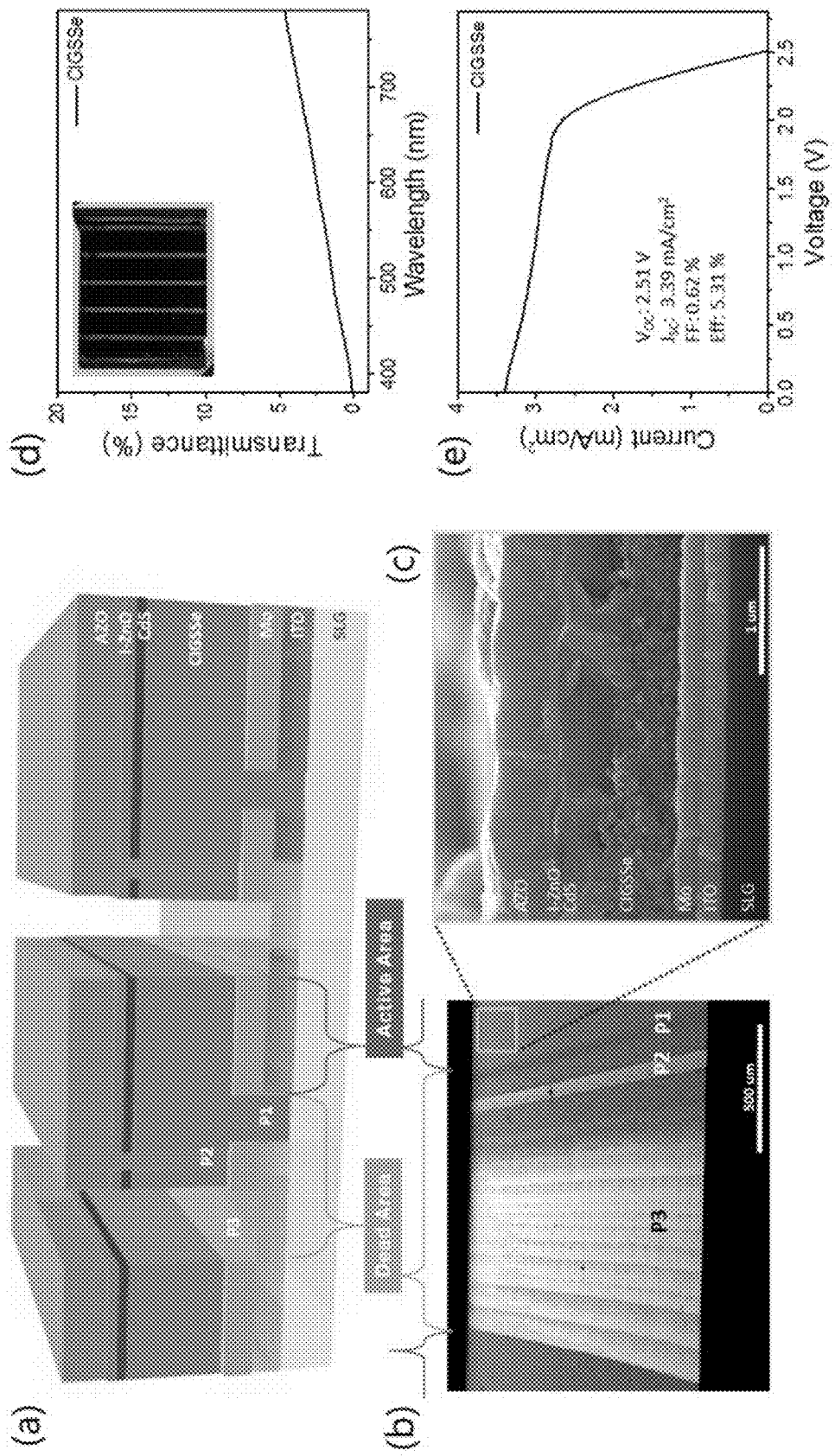
FIG. 11: (a) is a schematic lateral diagram of a CIGSSe PV module having incision patterns of P1, P2, and P3 according to one preferred embodiment of the present disclosure, (b) is a plan SEM image of the CIGSSe PV module, (c) is a lateral SEM image of the CIGSSe PV module corresponding to a quadrangular region of (b); (d) is a graph illustrating transmittance of the CIGSSe PV module, and (e) is a scanning graph of a current density-voltage of the CIGSSe PV module in lighting conditions of daylight and 1.5 AM.

Particularly, FIG. 10: (a) is a graph illustrating an external quantum efficiency (EQE) spectrum for a CIGSSe thin film solar cell according to one preferred embodiment of the present disclosure, and (b), (c), and (d) are each graphs illustrating diffusive reflectance spectra of BRF, YRF, and RRF together with the EQE spectra for the CIGSSe thin film solar cell before a CIGSSe PV module is converted. As can be seen from the drawings, in the case of the exterior or the interior which includes the CIGSSe thin film solar cell employing BRF, an overlap region between an absorption spectrum and a blue color reflection spectrum of the CIGSSe thin film solar cell is significantly small so that the exterior or the interior may exhibit aesthetically pleasing colors of reflected light without substantially lowering efficiency of the CIGSSe thin film solar cell.

Further, the present disclosure provides a method for manufacturing a thin film solar cell for BIPV, which includes Operation (1) of forming the first rear surface electrode 210, the second rear surface electrode 220, the light absorption layer 230, the buffer layer 240, the window layer 250, and the front surface electrode 260 on one surface of the substrate 100, Operation (2) of performing scribing to serially connect the first rear surface electrode 210, the second rear surface electrode 220, the light absorption layer 230, the buffer layer 240, the window layer 250, and the front surface electrode 260, and Operation (3) of forming a reflective filter 270 or 270' on the other surface of the substrate 100 or the front surface electrode 260, wherein the reflective filter 270 or 270' is configured to reflect a portion of externally emitted light and transmit the remaining portion thereof to visually change a color of the thin film solar cell for BIPV.

Hereinafter, the method will be described in detail except for the content overlapping with the above description.

The thin film solar cell for BIPV of the present disclosure may be manufactured such that the first rear surface electrode 210, the second rear surface electrode 220, the light absorption layer 230, the buffer layer 240, the window layer 250, and the front surface electrode 260 are formed on one surface of the substrate 100 through a conventional method for manufacturing a thin film solar cell. Also, the reflective filter 270 or 270' of the present disclosure may be manufactured such that coating is performed on the substrate 100 using an electron-beam evaporator. In accordance with one preferred embodiment of the present disclosure, the light absorption layer 230 may be manufactured by a solution-based process, chemical bath deposition (CBD) may be used when the buffer layer 240 is formed, and the buffer layer 240 and the window layer 250 may be formed through a radio frequency magnetron sputtering method. Also, a thickness of the buffer layer 240 may be preferably in a range of 40 to 80 nm.

In accordance with one preferred embodiment of the present disclosure, 7 to 13 volume % of each of the first rear surface electrode 210, the second rear surface electrode 220, the light absorption layer 230, the buffer layer 240, the window layer 250, and the front surface electrode 260 may be scribed. The scribing of the present disclosure may be performed through laser scribing or mechanical scribing. Preferably, when the second rear surface electrode 220 is opaque, a portion of the second rear surface electrode 220 may be removed through laser scribing, and the light absorption layer 230, the buffer layer 240, and the window layer 250 may be removed through mechanical scribing to connect between the second rear surface electrode 220 and the front surface electrode 260. Also, the light absorption layer 230, the buffer layer 240, and the window layer 250 may be removed through mechanical scribing to serially connect the substrate 100, the upper surface part 200, and the lower surface part 300. Subsequently, the reflective filter 270 or 270', which is configured to reflect a portion of externally emitted light and transmit the remaining portion thereof to visually change a color of a solar cell, may be provided on the other surface of the substrate 100 or the front surface electrode 260 to manufacture the thin film solar cell for BIPV.

Consequently, the present disclosure provides the thin film solar cell for BIPV, which is capable of improving a utility value for the exterior or the interior by visually changing a black color of a thin film solar cell into an aesthetically pleasing color of light reflected therefrom to exhibit an exterior appearance having the aesthetically pleasing color without substantially lowering efficiency required for a solar cell to thereby facilitate commercialization of the thin film solar cell for BIPV, and the exterior or the interior including the same. Further, even when the thin film solar cell for BIPV, and the exterior or the interior including the same are utilized for a finishing material of a building envelope, a maximum PCE required for a solar cell may be maintained, and a black color of an inorganic thin film solar cell may be visually changed into an aesthetically pleasing color of reflected light therefrom with only a slight reduction of relative harvesting efficiency and a short circuit photocurrent density without a decrease of an open circuit voltage $V_{oc}$ such that the thin film solar cell for BIPV and the exterior or the interior including the same, which are obtainable from the present disclosure, may be variously utilized in an outer side surface of the building as well as in an interior thereof.

Hereinafter, embodiments of the present disclosure will be described. However, the scope of the present disclosure is not limited to these embodiments.

Embodiment 1

(1) Manufacture of CIGSSe Solar Cell

A solar cell element is manufactured according to a conventional structure configured with substrate/first rear surface electrode/second rear surface electrode/CIGSSe/CdS/i-ZnO/n-ZnO. A CIGSSe light absorption layer is manufactured through a solution-based method. A CdS buffer layer having a thickness of 60 nm is formed on the CIGSSe light absorption layer by CBD, and the n-ZnO layer (having a thickness of 500 nm) doped with i-ZnO (having a thickness of 50 nm)/Al is deposited through a radio frequency magnetron sputtering method. A solar cell module is manufactured through a three-stage scribing process of P1, P2, and P3. Particularly, the second rear surface electrode 220 is partially removed through a laser scribing process (P1), the CIGSSe/CdS/i-ZnO layers are partially removed through a mechanical scribing process to connect between the second rear surface electrode 220 and the n-ZnO layer (P2), and the CIGSSe/CdS/i-ZnO layers are partially removed through the mechanical scribing process to serially connect a CIGSSe solar cell (P3) (See FIG. 6).

(2) Manufacture and preparation of one-dimensional photonic crystal nano-multilayered BRF A one-dimensional photonic crystal dichroic nano-multilayered BRF is manufactured on a glass substrate. To design the one-dimensional photonic crystal dichroic nano-multilayered BRF, reflectance (R), transmittance (T), and absorption (A) are simulated using a characteristic matrix method. The one-dimensional photonic crystal dichroic nano-multilayered BRF is configured such that a $TiO_2$ layer having a ⅛ optical thickness with respect to a center wavelength of reflected light and a $SiO_2$ layer having a ¼ optical thickness with respect thereto are applied on the glass substrate using an electron-beam evaporator to form a structure of $[0.5TiO_2/SiO_2/0.5TiO_2]^9$. The one-dimensional photonic crystal dichroic BRF nano-multilayer film is provided at an upper surface part or a lower surface part of a substrate of the CIGSSe solar cell to manufacture a thin film solar cell for BIPV.

Embodiment 2

A one-dimensional photonic crystal dichroic nano-multilayered YRF is manufactured, and Embodiment 2 is the same as Embodiment 1 except that the $TiO_2$ layer having a ⅛ optical thickness with respect to the center wavelength of the reflected light and the $SiO_2$ layer having the ¼ optical thickness with respect thereto are applied on the glass substrate using the electron-beam evaporator to form a structure of $[0.5SiO_2/TiO_2/0.5SiO_2]^9$.

Embodiment 3

Except that a one-dimensional photonic crystal dichroic nano-multilayered RRF is manufactured, Embodiment 3 is the same as Embodiment 2.

COMPARATIVE EXAMPLE

Except that the one-dimensional photonic crystal dichroic nano-multilayered BRF, YRF, and RRF are not formed, a thin film solar cell for BIPV is manufactured the same as in Embodiment 1.

Experimental Example 1: Measurement of Current Density-Voltage (J-V)

A current density-voltage (J-V) of each of the CIGSSe thin film solar cells, which are manufactured through Embodiments 1, 2, and 3, and Comparative Example, is measured using Keithley 2401 equipped with a 150-watt (W) xenon lamp (Manufacturer: Newport Co.). A light source is calibrated by a KG-5 filter, and all the J-V measurements for Embodiments 1 to 3, in which the one-dimensional photonic crystal dichroic nano-multilayered BRF, YRF, and RRF are each attached to an exterior or an interior of a CIGSSe PV module, are performed in a lighting condition of daylight. Measurement results are shown in the following Tables 1 and 2.

Experimental Example 2: Measurement of Transmittance Spectrum and Reflection Spectrum A transmittance spectrum of each of the CIGSSe thin film solar cells, which are manufactured through Embodiments 1, 2, and 3, and Comparative Example, is measured using the S-3100 system (Manufacturer: Scinco Co. Ltd.), and a diffusive reflectance spectrum of each thereof is measured using an LS-F100HS apparatus equipped with a 100 W halogen lamp (Manufacturer: PSI).

Experimental Example 3: Observation of SEM Images

SEM images of the CIGSSe thin film solar cells, which are manufactured through Embodiments 1, 2, and 3, and Comparative Example, are observed using a JSM-7610F apparatus.

Experimental Example 4: Measurement of Other Efficiencies

An open circuit voltage $V_{oc}$, a fill factor FF, and light harvesting efficiency Eff of each of the CIGSSe thin film solar cells, which are manufactured through Embodiments 1, 2, and 3, and Comparative Example, are measured and shown in the following Tables 1 and 2.

TABLE 1

|  | $V_{oc}$ (V) | $J_{sc}$ (mA/cm$^2$) | FF (%) | Eff (%) | A/B |
|---|---|---|---|---|---|
| Embodiment 1 | 2.49 | 2.80 | 0.61 | 4.28 | 0.81 |
| Embodiment 1' | 2.44 | 2.94 | 0.59 | 4.22 | 0.79 |
| Embodiment 2 | 2.39 | 1.90 | 0.55 | 2.49 | 0.47 |
| Embodiment 2' | 2.39 | 1.83 | 0.54 | 2.36 | 0.44 |
| Embodiment 3 | 2.39 | 1.93 | 0.55 | 2.54 | 0.48 |
| Embodiment 3' | 2.37 | 1.88 | 0.54 | 2.42 | 0.46 |
| Comparative Example | 2.51 | 3.39 | 0.62 | 5.31 | 1.00 |

A is light harvesting efficiency when one or more one-dimensional photonic crystal dichroic nano-multilayered films are employed, and B is light harvesting efficiency when a one-dimensional photonic crystal dichroic nano-multilayered film is not employed. Each of Embodiment 1 and Embodiment 1' represents the thin film solar cell for BIPV, which is manufactured according to Embodiment 1. The above-described manner is the same for Embodiment 2' and Embodiment 3'.

Table 1 shows the measurement results of efficiencies for the thin film solar cells for BIPV, which are manufactured according to Embodiments 1 to 3' and Comparative Example by providing the one-dimensional photonic crystal dichroic nano-multilayered BRF, YRF, and RRF at the exteriors of the thin film solar cells for BIPV. As can be seen from Table 1, $V_{oc}$ of the thin film solar cell for BIPV, with which a color of reflected light therefrom is visually changed, according to Embodiments 1 to 3' is maintained substantially similar to that of a conventional black colored thin film solar cell for BIPV, and further the fill factor FF thereof is maintained substantially similar to that of the conventional black colored thin film solar cell for BIPV. In addition, a current density $J_{sc}$ and the light harvesting efficiency Eff are each not substantially reduced when compared to 3.39 and 5.31 of Comparative Example. That is, even when the thin film solar cell for BIPV of the present disclosure is utilized on an outer side surface of a building, it can be seen that the efficiency of the thin film solar cell for BIPV may not be substantially reduced and also the black color thereof may be visually changed into an aesthetically pleasing color of reflected light to be usefully utilized for the exterior or the interior.

Also, in the case of the thin film solar cell for BIPV employing the one-dimensional photonic crystal dichroic nano-multilayered BRF according to Embodiments 1 or 1', it can be seen that A/B exhibits a significantly high value of 0.81 or 0.79 and also the fill factor FF has a value similar to that of the conventional thin film solar cell. Furthermore, it can be verified that $V_{oc}$ and the current density $J_{sc}$ are also slightly reduced and thus the thin film solar cell for BIPV exhibits an exterior appearance having an aesthetically pleasing blue or violet color and also has high efficiency so that a utility value for the exterior or the interior is high.

TABLE 2

|  | $V_{oc}$ (V) | $J_{sc}$ (mA/cm$^2$) | FF (%) | Eff (%) | A/B |
|---|---|---|---|---|---|
| Embodiment 1 | 2.54 | 3.27 | 0.62 | 5.14 | 0.97 |
| Embodiment 1' | 2.52 | 3.29 | 0.62 | 5.10 | 0.96 |
| Embodiment 2 | 2.50 | 3.31 | 0.61 | 5.04 | 0.95 |
| Embodiment 2' | 2.48 | 3.35 | 0.60 | 4.97 | 0.94 |
| Embodiment 3 | 2.48 | 3.33 | 0.61 | 5.03 | 0.95 |
| Embodiment 3' | 2.49 | 3.36 | 0.61 | 5.07 | 0.95 |
| Comparative Example | 2.51 | 3.39 | 0.62 | 5.31 | 1.00 |

A is light harvesting efficiency when one or more one-dimensional photonic crystal dichroic nano-multilayered films are employed, and B is light harvesting efficiency when a one-dimensional photonic crystal dichroic nano-multilayered film is not employed. Each of Embodiment 1 and Embodiment 1' represents the thin film solar cell for BIPV, which is manufactured according to Embodiment 1. The above-described manner is the same for Embodiment 2' and Embodiment 3'.

Table 2 shows the measurement results of efficiencies with respect to the thin film solar cells for BIPV, which are manufactured according to Embodiments 1 to 3' and Comparative Example by providing with the one-dimensional photonic crystal dichroic nano-multilayered BRF, YRF, and RRF in the interiors of the thin film solar cells for BIPV. As can be seen from Table 2, $V_{oc}$ of the thin film solar cell for BIPV, with which a color of reflected light therefrom is visually changed, according to Embodiments 1 to 3' is maintained substantially similar to that of the conventional black colored thin film solar cell for BIPV, and further the fill factor FF thereof is maintained substantially similar to that of the conventional black colored thin film solar cell for BIPV. In addition, it can be seen that the current density $J_{sc}$ and the light harvesting efficiency Eff are each substantially similar to 3.39 and 5.31 of Comparative Example. That is, even when the thin film solar cell for BIPV of the present disclosure is utilized for an interior of a building, it can be seen that the efficiency of the thin film solar cell for BIPV may not be substantially reduced and also the black color thereof may be visually changed into an aesthetically pleasing color of reflected light to be usefully utilized for the exterior or the interior.

The present disclosure provides a thin film solar cell for BIPV, which is capable of improving a utility value for the exterior or the interior by visually changing a black color of an inorganic thin film solar cell into an aesthetically pleasing color of reflected light therefrom to exhibit an exterior appearance having the aesthetically pleasing color without substantially lowering efficiency required for a solar cell to thereby facilitate commercialization of the inorganic thin film solar cell, and a method for manufacturing the same.

Further, the present disclosure provides a thin film solar cell for BIPV, which is capable of maintaining a maximum PCE required for a solar cell even when used as a finishing material of a building envelope, and visually changing a black color of an inorganic thin film solar cell into an aesthetically pleasing color of reflected light therefrom to be suitable for the exterior or the interior with only a slight reduction of relative harvesting efficiency and a short circuit photocurrent density without a decrease of an open circuit voltage $V_{oc}$, and a method for manufacturing the same.

What is claimed is:

1. A thin film solar cell for Building Integrated PhotoVoltaic (BIPV), comprising:
    a substrate;
    an upper surface part of the substrate, the upper surface part including an electrode; and
    a lower surface part of the substrate,
    wherein a reflective filter is included in one or more of the upper surface part and the lower surface part, and is configured to reflect a portion of externally emitted light and transmit the remaining portion thereof to visually change a color of the thin film solar cell for BIPV into a color of reflected light therefrom,
    wherein the reflective filter is a one-dimensional photonic crystal dichroic nano-multilayered film,
    wherein the one-dimensional photonic crystal dichroic nano-multilayered film is configured such that a first layer, a second layer, and a third layer are alternately stacked, a refractive index of the second layer is different from that of the first layer, and a refractive index of the third layer is the same as or different from that of the first layer, and
    wherein an optical thickness of each of the first layer and the third layer is in a range of $1/9$ to $1/7$ optical thickness with respect to a center wavelength of the reflected light, and an optical thickness of the second layer is in a range of $1/5$ to $1/3$ optical thickness with respect to the center wavelength of the reflected light.

2. The thin film solar cell of claim 1,
    wherein the electrode includes a first rear surface electrode, a front surface electrode, and a second rear surface electrode,
    wherein the upper surface part includes:
    the first rear surface electrode and the front surface electrode which are formed to face each other on one surface of the substrate;
    the second rear surface electrode formed between the first rear surface electrode and the front surface electrode; and
    a light absorption layer formed between the second rear surface electrode and the front surface electrode,
    wherein the front surface electrode is disposed at a side opposite to the substrate with respect to the first rear surface electrode.

3. The thin film solar cell of claim 2, wherein the reflective filter is provided on the front surface electrode.

4. The thin film solar cell of claim 1, wherein the one-dimensional photonic crystal dichroic nano-multilayered film is a one-dimensional photonic crystal dichroic nano-multilayered blue color reflective film.

5. The thin film solar cell of claim 1, wherein, when the first layer, the second layer, and the third layer are alternately stacked, a repetition unit configured with the first-second-third layers is repeatedly stacked 3 to 30 times.

6. The thin film solar cell of claim 1, wherein a thickness of the reflective filter is in a range of 0.3 to 5 micrometers (μm).

7. The thin film solar cell of claim 1, wherein the thin film solar cell is scribed to serially connect the substrate, the upper surface part, and the lower surface part, and the reflective filter is not scribed.

8. A window which includes the thin film solar cell of claim 1.

* * * * *